(12) United States Patent
Kim et al.

(10) Patent No.: US 12,394,956 B2
(45) Date of Patent: Aug. 19, 2025

(54) SURFACE EMITTING LASER PACKAGE HAVING A DIFFUSION PART HAVING GLASS AND POLYMER LAYERS AND LIGHT EMITTING DEVICE INCLUDING THE SAME

(71) Applicant: LG INNOTEK CO., LTD., Seoul (KR)

(72) Inventors: Myung Sub Kim, Seoul (KR); Baek Jun Kim, Seoul (KR); Ho Jae Kang, Seoul (KR); Ju Young Park, Seoul (KR); Ba Ro Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 904 days.

(21) Appl. No.: 17/054,937

(22) PCT Filed: May 13, 2019

(86) PCT No.: PCT/KR2019/005696
§ 371 (c)(1),
(2) Date: Dec. 30, 2020

(87) PCT Pub. No.: WO2019/216724
PCT Pub. Date: Nov. 14, 2019

(65) Prior Publication Data
US 2021/0234335 A1     Jul. 29, 2021

(30) Foreign Application Priority Data

May 11, 2018  (KR) ........................ 10-2018-0054094
May 23, 2018  (KR) ........................ 10-2018-0058068
Aug. 27, 2018 (KR) ........................ 10-2018-0100264

(51) Int. Cl.
*H01S 5/02257*     (2021.01)
*F21K 9/65*        (2016.01)
(Continued)

(52) U.S. Cl.
CPC ............ *H01S 5/02257* (2021.01); *F21K 9/65* (2016.08); *H01S 5/02208* (2013.01);
(Continued)

(58) Field of Classification Search
CPC ............ H01S 5/02257; H01S 5/02208; H01S 5/02218; H01S 5/0236; H01S 5/183; H01S 5/423; F21K 9/65
See application file for complete search history.

(56) References Cited

U.S. PATENT DOCUMENTS 5,801,402 A   9/1998  Shin
5,997,185 A  12/1999  Kropp
(Continued)

FOREIGN PATENT DOCUMENTS

CN     101026216 A    8/2007
CN     102779932 A   11/2012
(Continued)

OTHER PUBLICATIONS

International Search Report, issued in PCT/KR2019/005696, dated Aug. 28, 2019.

*Primary Examiner* — M. A. Golub-Miller
(74) *Attorney, Agent, or Firm* — Birch, Stewart, Kolasch & Birch, LLP

(57) ABSTRACT

The embodiment relates to a surface emitting laser package and a light emitting device including the same.
The surface-emitting laser package according to the embodiment may include a housing including a cavity, a surface-emitting laser device disposed in the cavity, and a diffusion unit disposed on the housing. The diffusion unit may include a polymer layer and a glass layer disposed on the polymer layer. The polymer layer may include a first polymer layer vertically overlapping the surface emitting laser device, and a second polymer layer not vertically overlapping the sur-
(Continued)

face emitting laser device. The thickness of the first polymer layer may be thinner than the thickness of the second polymer layer.

6 Claims, 33 Drawing Sheets

(51) Int. Cl.
    *H01S 5/02208*     (2021.01)
    *H01S 5/02218*     (2021.01)
    *H01S 5/0236*     (2021.01)
    *H01S 5/183*     (2006.01)
    *H01S 5/42*     (2006.01)

(52) U.S. Cl.
    CPC ........ *H01S 5/02218* (2021.01); *H01S 5/0236* (2021.01); *H01S 5/183* (2013.01); *H01S 5/423* (2013.01)

(56) References Cited

U.S. PATENT DOCUMENTS

| | | | |
|---|---|---|---|
| 6,692,979 B2 | 2/2004 | Yeh et al. | |
| 6,778,574 B1* | 8/2004 | Shimonaka | H10H 20/853 372/36 |
| 6,816,523 B1* | 11/2004 | Glenn | H01S 5/0683 372/36 |
| 9,634,466 B2 | 4/2017 | Kim | |
| 10,714,660 B2* | 7/2020 | Kim | H10H 20/8506 |
| 2002/0057883 A1* | 5/2002 | Malone | G02B 6/4232 385/136 |
| 2005/0029002 A1* | 2/2005 | Nemoto | H01S 5/02325 174/565 |
| 2007/0126010 A1* | 6/2007 | Chua | H10F 77/413 257/E31.127 |
| 2008/0179503 A1* | 7/2008 | Camargo | H10F 77/50 257/E33.059 |
| 2009/0232451 A1 | 9/2009 | Shibayama | |
| 2014/0355251 A1* | 12/2014 | Kahrs | F21V 33/0052 438/27 |
| 2014/0355265 A1* | 12/2014 | Kimiya | F21K 9/65 362/249.02 |
| 2015/0003482 A1* | 1/2015 | Monadgemi | H01S 5/0222 372/44.01 |
| 2015/0102375 A1* | 4/2015 | Kim | H10H 20/854 257/98 |
| 2015/0176802 A1* | 6/2015 | Malkmus | G02B 19/0061 362/296.01 |
| 2015/0192272 A1* | 7/2015 | Berg | F21V 14/08 362/84 |
| 2016/0181479 A1* | 6/2016 | Kim | H10H 20/855 257/98 |
| 2017/0117443 A1* | 4/2017 | Kim | H10H 20/8506 |
| 2017/0350581 A1 | 12/2017 | Balimann et al. | |
| 2017/0353004 A1 | 12/2017 | Chen et al. | |
| 2019/0146319 A1* | 5/2019 | Stapleton | H01S 5/02208 372/50.124 |
| 2020/0036161 A1* | 1/2020 | Kim | H01S 5/02257 |
| 2020/0049339 A1* | 2/2020 | Tsai | F21V 3/061 |
| 2020/0049911 A1* | 2/2020 | Tsai | H01S 5/02345 |
| 2020/0051965 A1* | 2/2020 | Tsai | H10F 55/00 |
| 2020/0220324 A1* | 7/2020 | Lee | G02B 5/0215 |
| 2020/0278426 A1* | 9/2020 | Dummer | H01S 5/06835 |
| 2020/0370730 A1* | 11/2020 | Hansen | F21L 4/005 |
| 2021/0098964 A1* | 4/2021 | Kim | H01S 5/423 |
| 2021/0104648 A1* | 4/2021 | Lee | H10H 20/831 |
| 2021/0184423 A1* | 6/2021 | Kanazawa | H01S 5/02257 |
| 2021/0408342 A1* | 12/2021 | Zhou | H10H 20/856 |
| 2022/0085572 A1* | 3/2022 | Miller | H01S 5/02257 |
| 2022/0115837 A1* | 4/2022 | Tsai | H01S 5/0014 |
| 2022/0320386 A1* | 10/2022 | Sun | H10H 20/855 |

FOREIGN PATENT DOCUMENTS

| | | |
|---|---|---|
| JP | 63-265479 A | 11/1988 |
| JP | 2008-147334 A | 6/2008 |
| JP | 2012-19038 A | 1/2012 |
| KR | 10-0269710 B1 | 10/2000 |
| KR | 10-0366695 B1 | 3/2003 |
| KR | 10-2006-0067169 A | 6/2006 |
| KR | 10-2008-0042834 A | 5/2008 |
| KR | 10-2008-0087218 A | 10/2008 |
| KR | 10-2009-0019763 A | 2/2009 |
| KR | 10-2011-0090126 A | 8/2011 |
| KR | 10-2012-0127109 A | 11/2012 |
| KR | 10-2015-0014615 A | 2/2015 |
| KR | 10-2015-0133048 A | 11/2015 |
| KR | 10-2018-0000969 A | 1/2018 |
| KR | 10-1869552 B1 | 6/2018 |

* cited by examiner

[Figure 1]
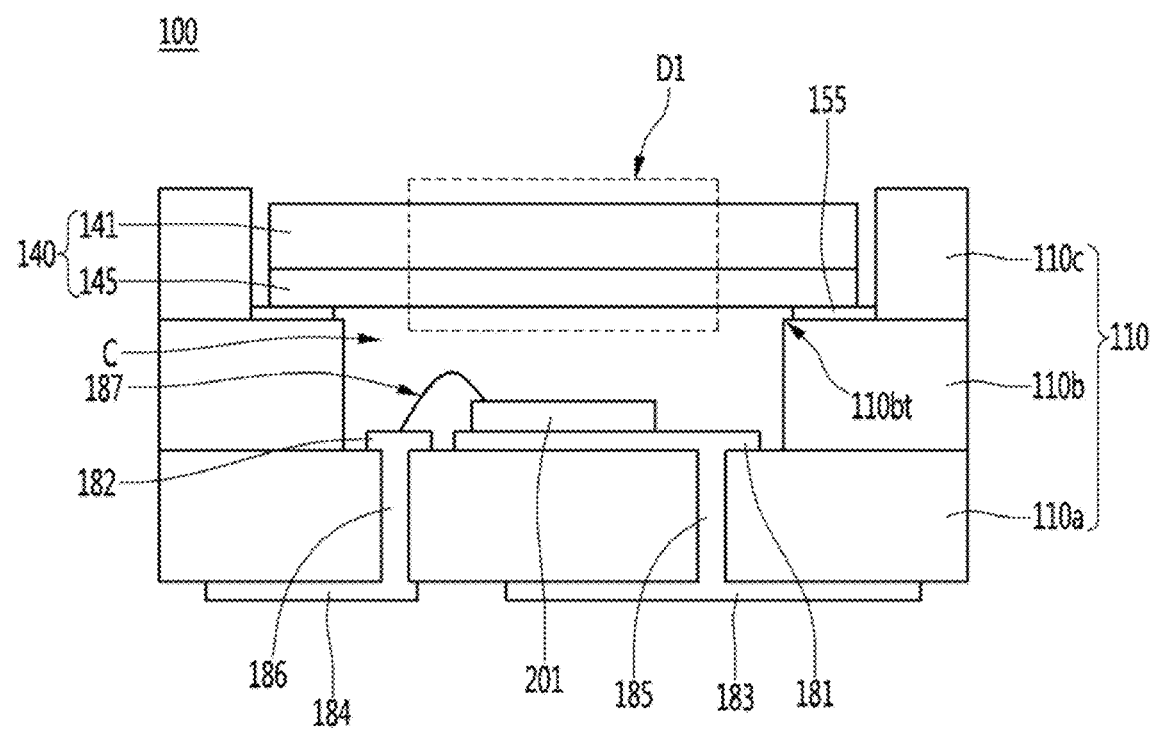

[Figure 2]
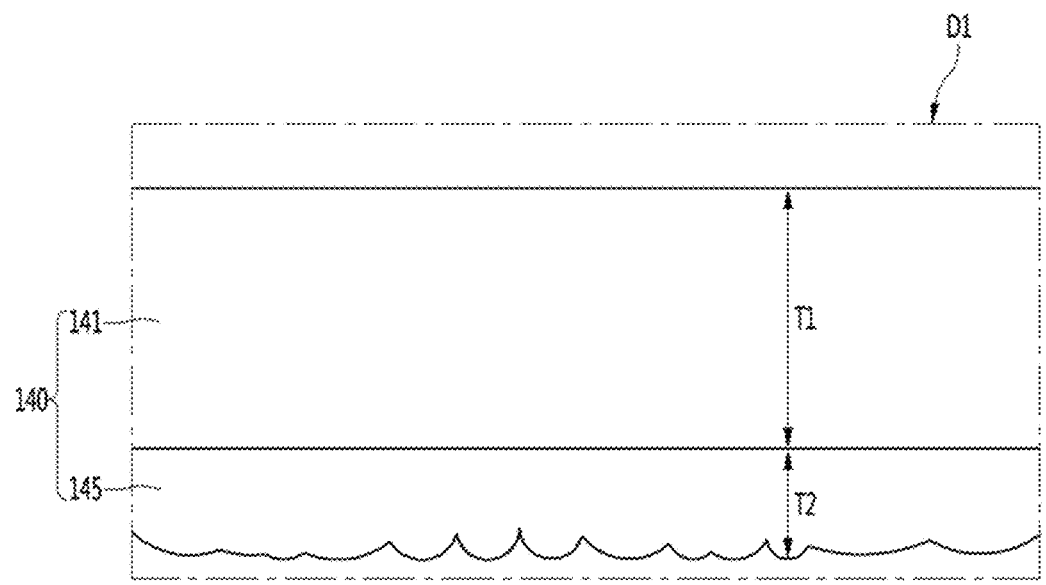

[Figure 3]
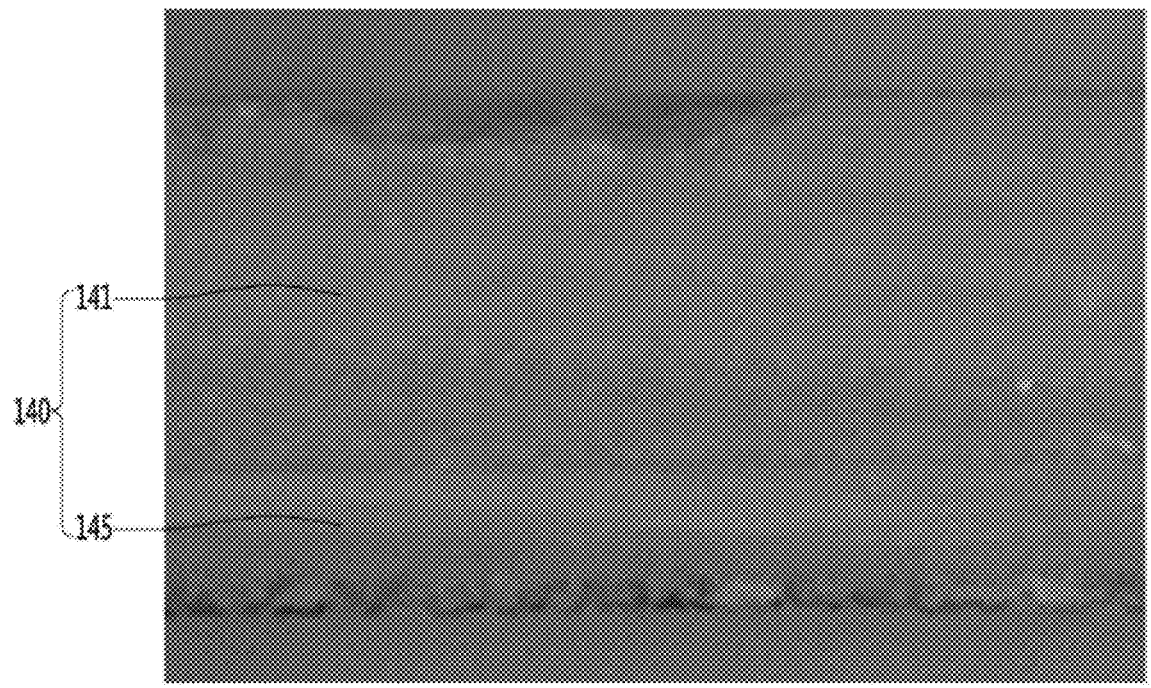
[Figure 4]
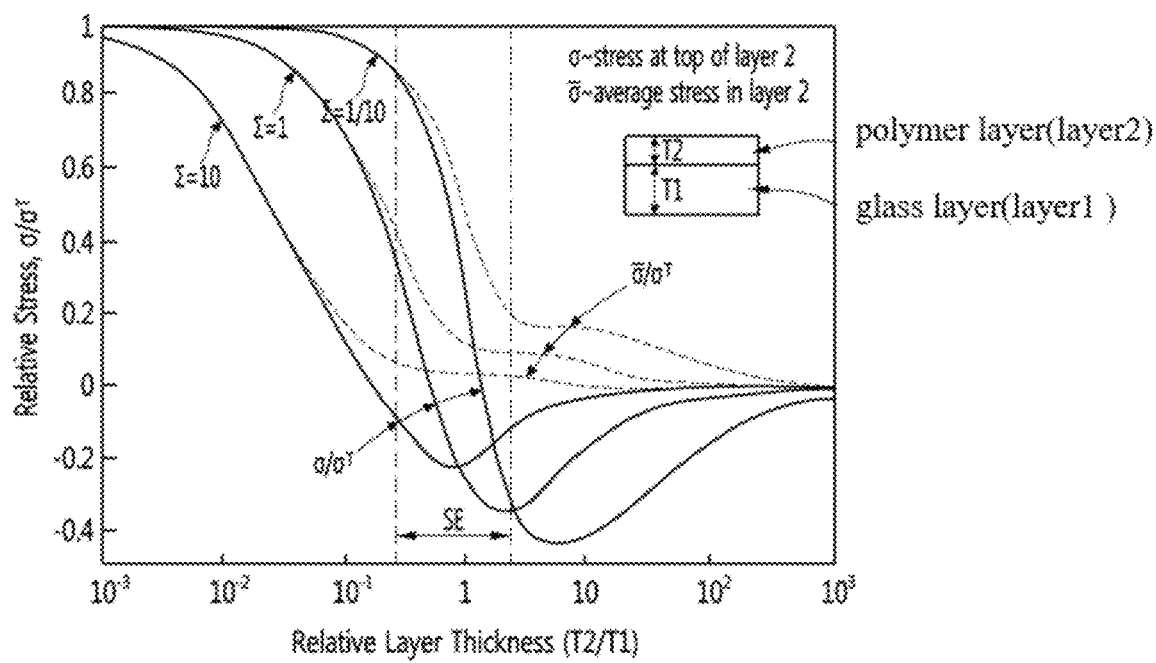

[Figure 5]
(a)
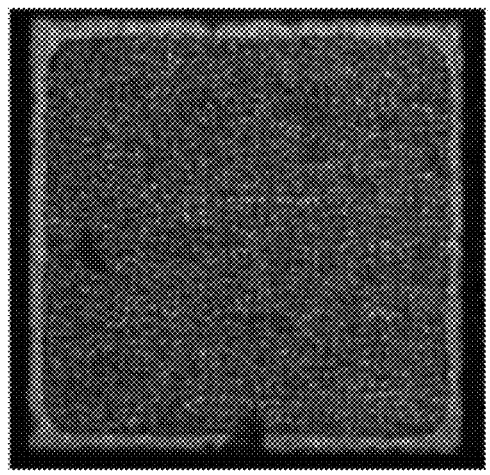
(c)
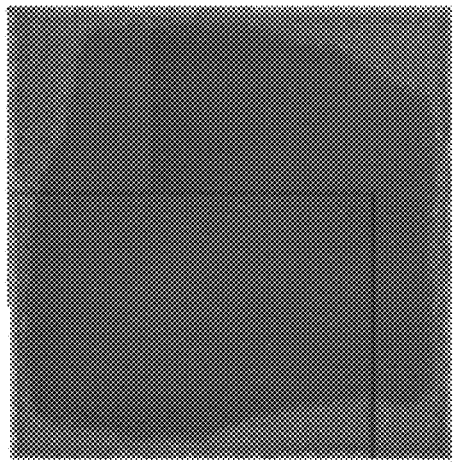
(b)
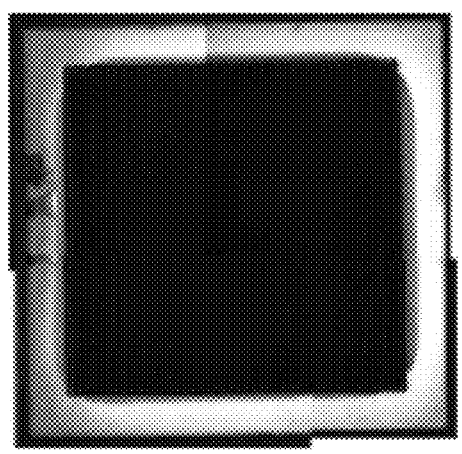
(d)

[Figure 6]
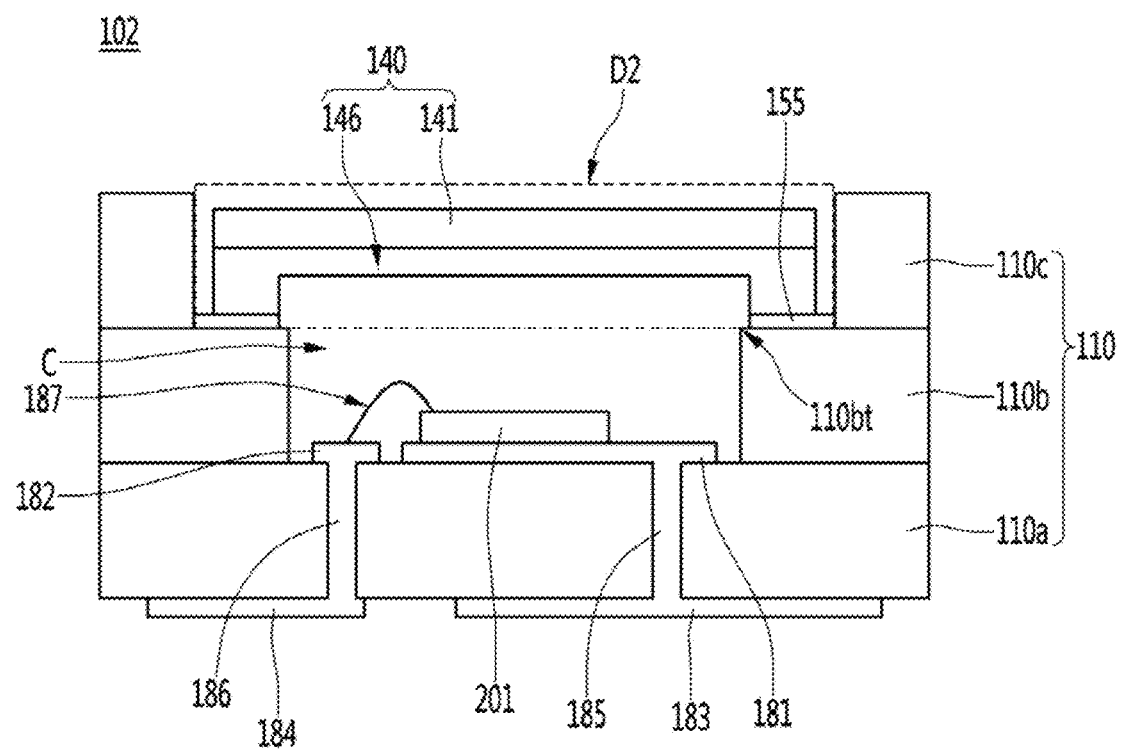

[Figure 7]
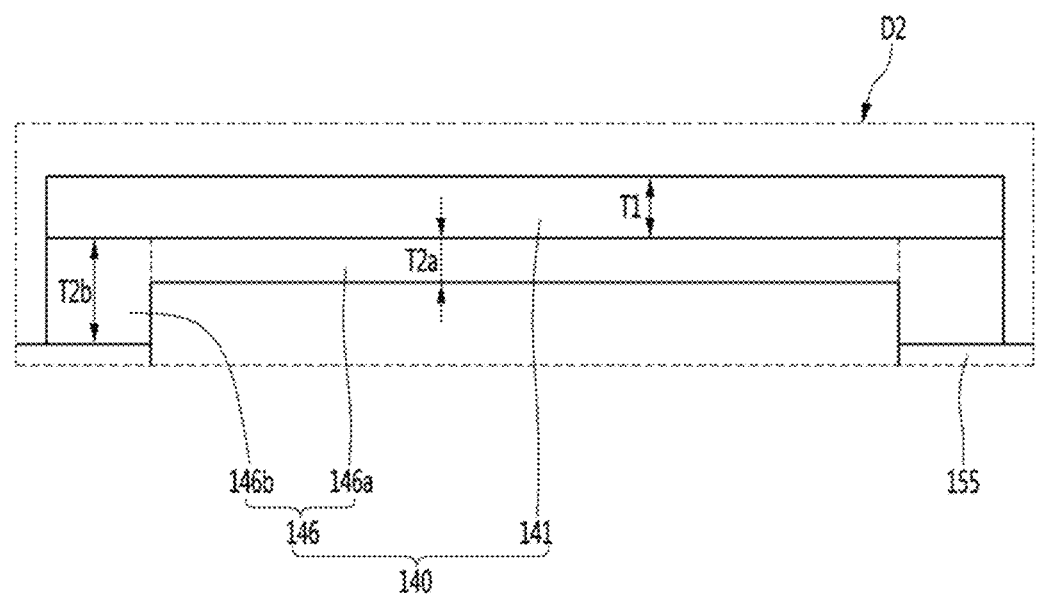

[Figure 8]
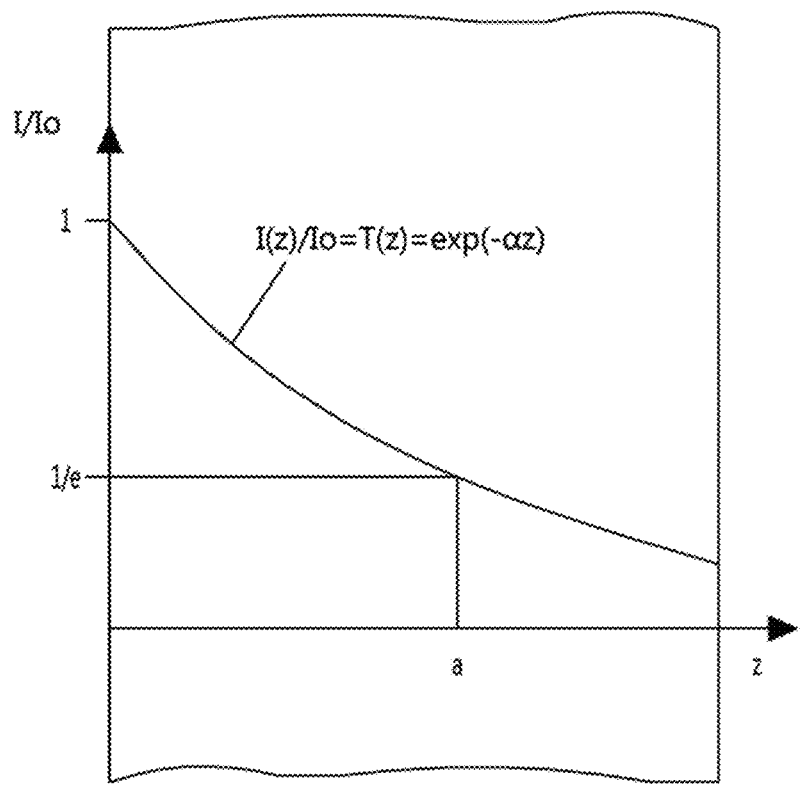
[Figure 9]
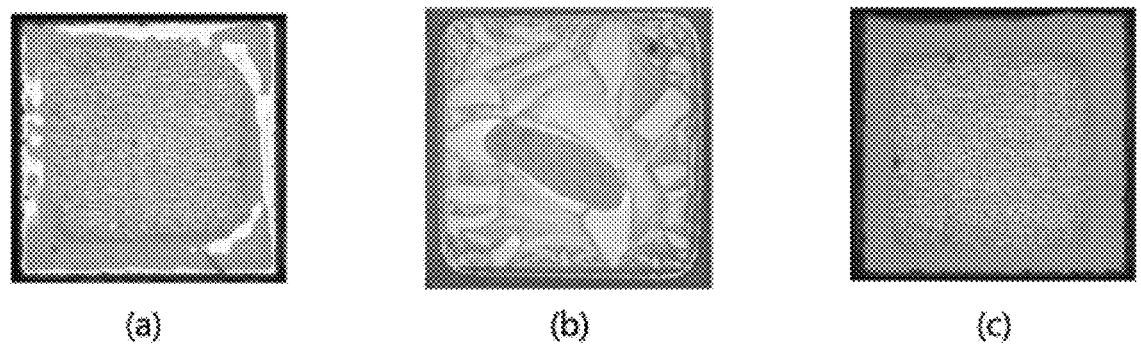
(a)          (b)          (c)

[Figure 10]
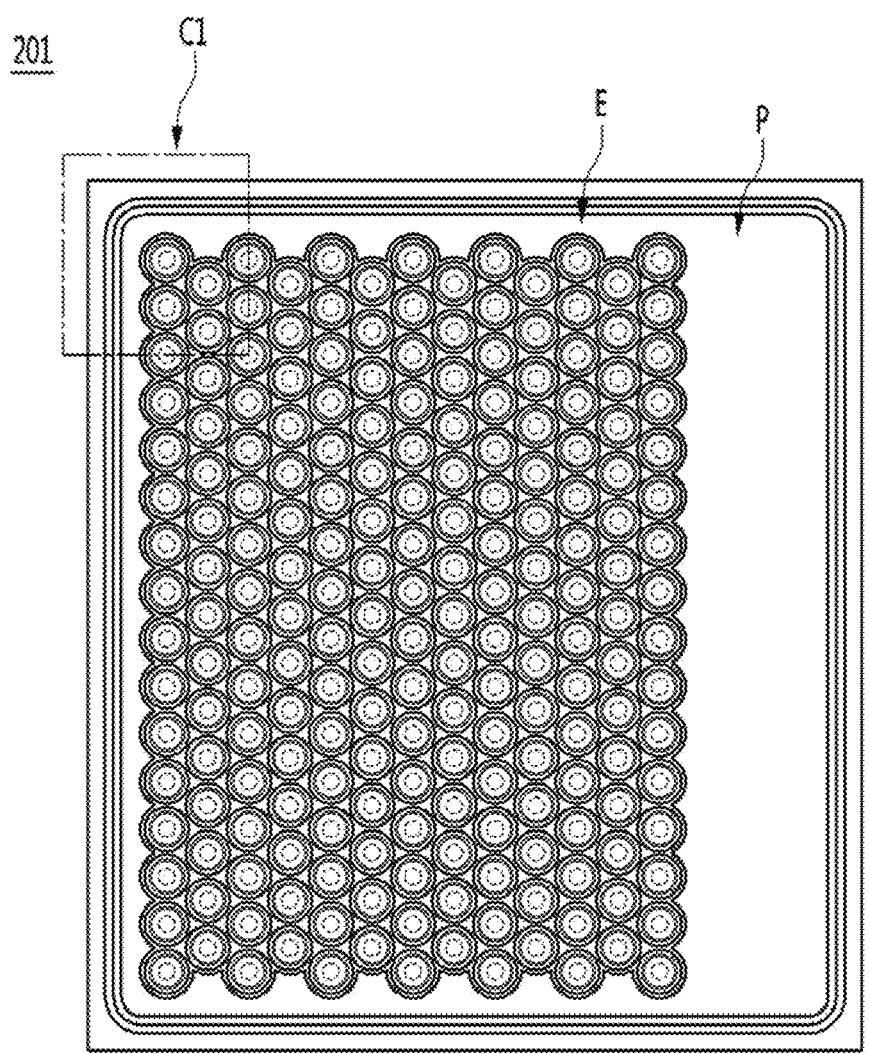

[Figure 11]
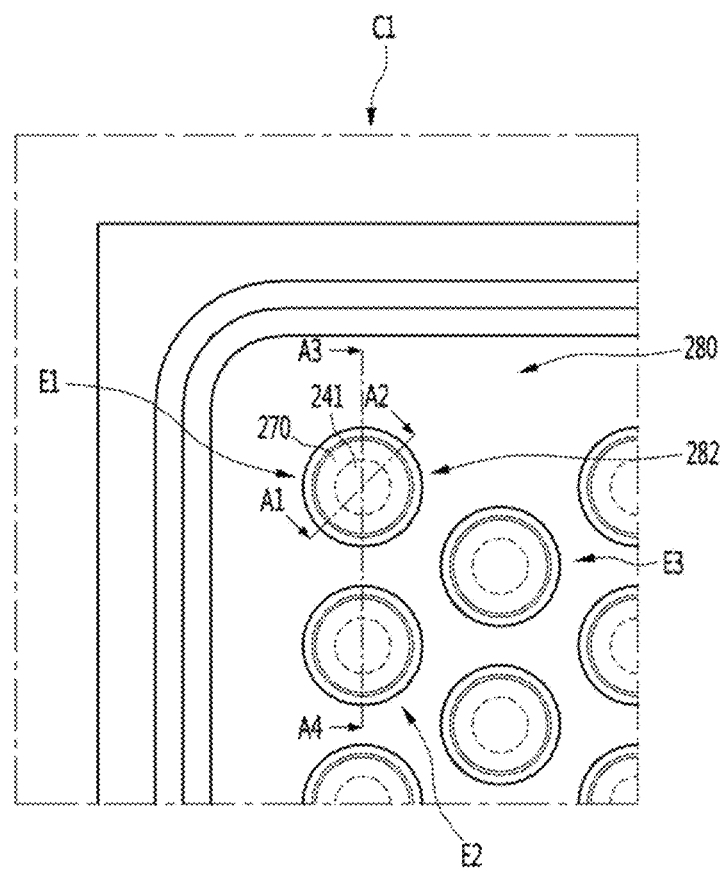

[Figure 12]
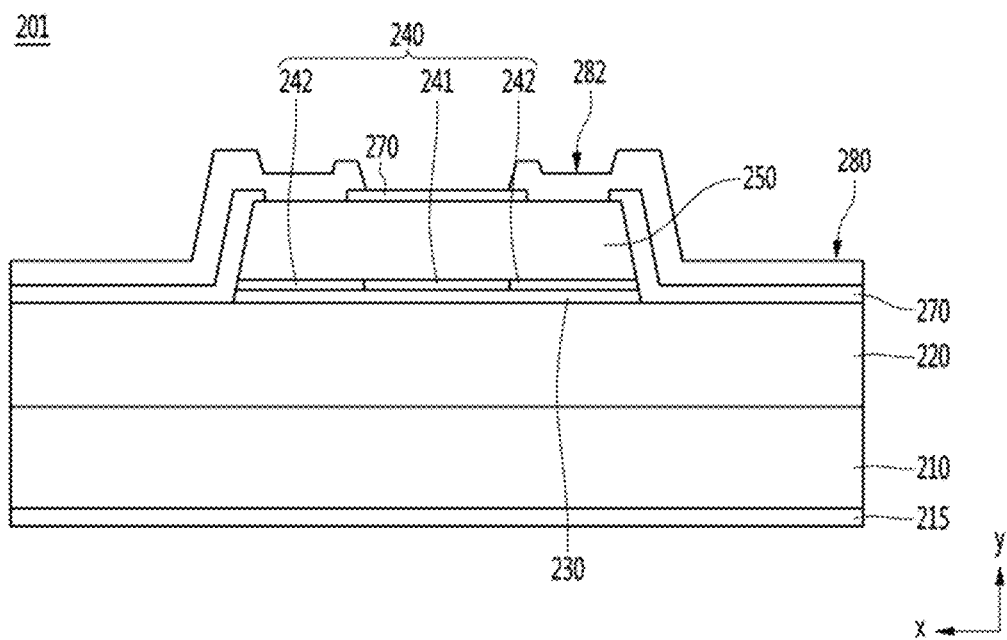

[Figure 13]
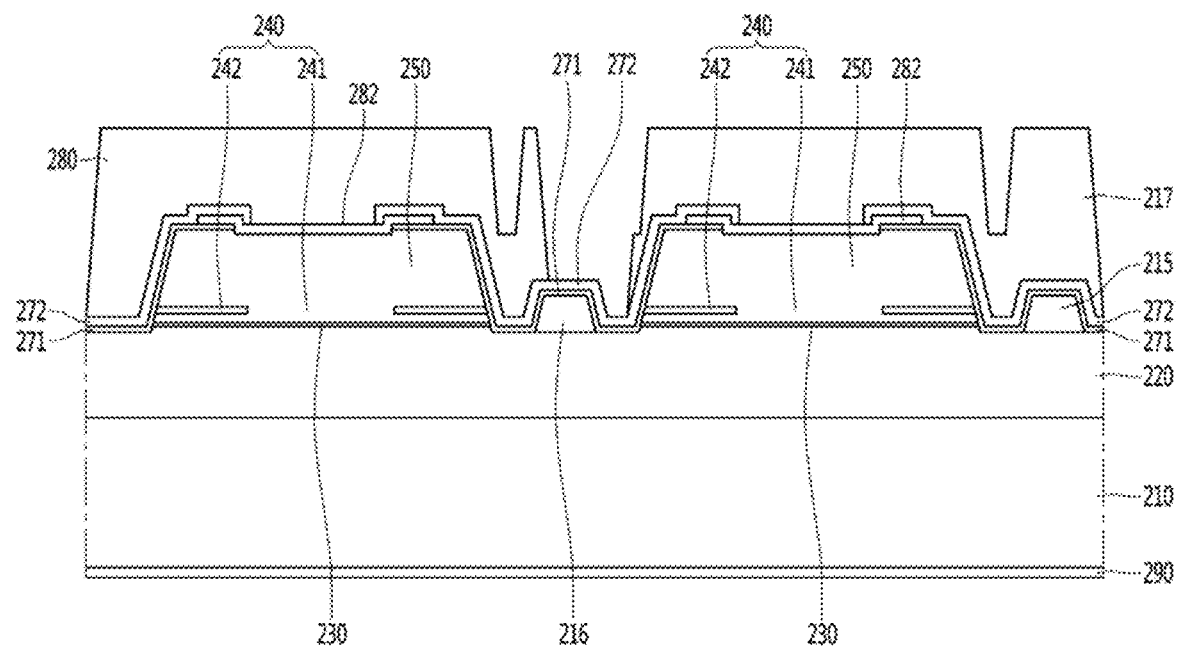

[Figure 14]
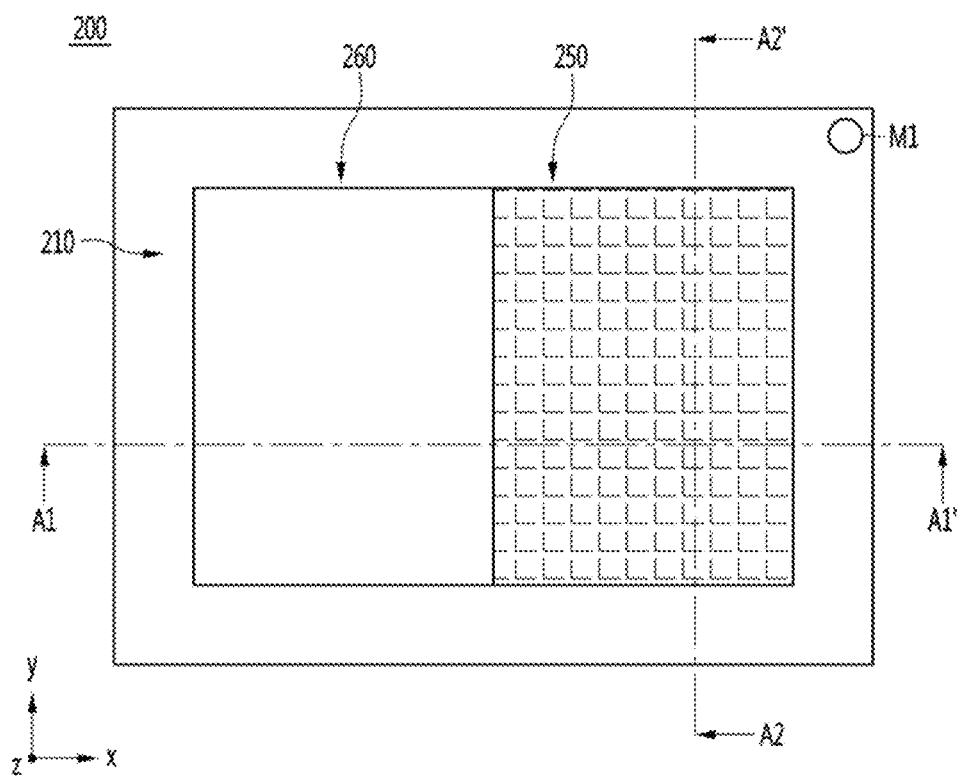

[Figure 15]
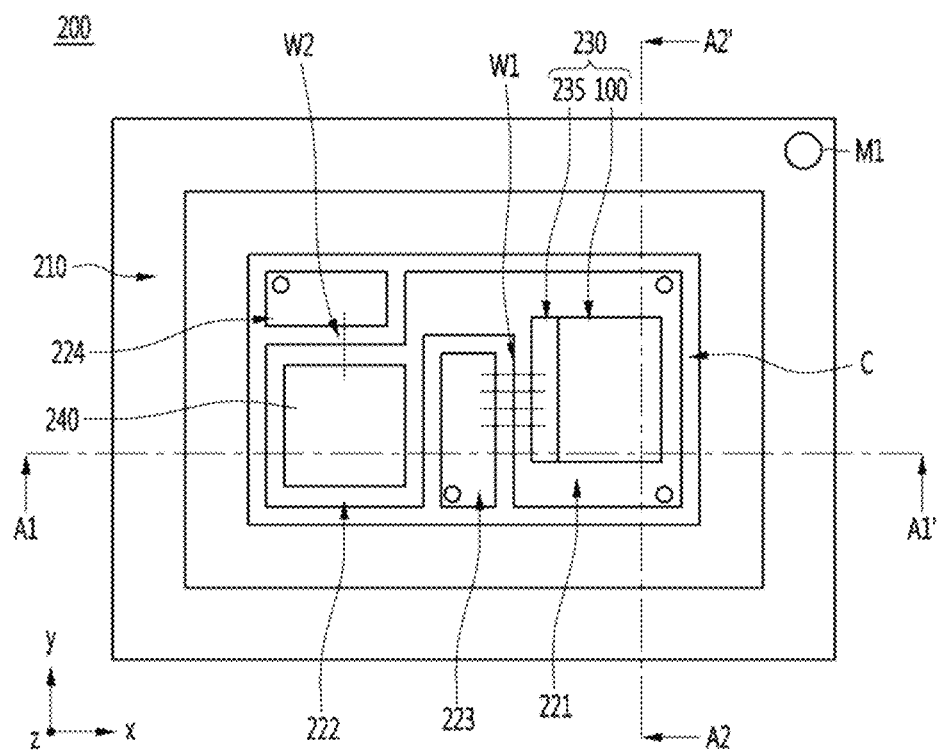

[Figure 16a]
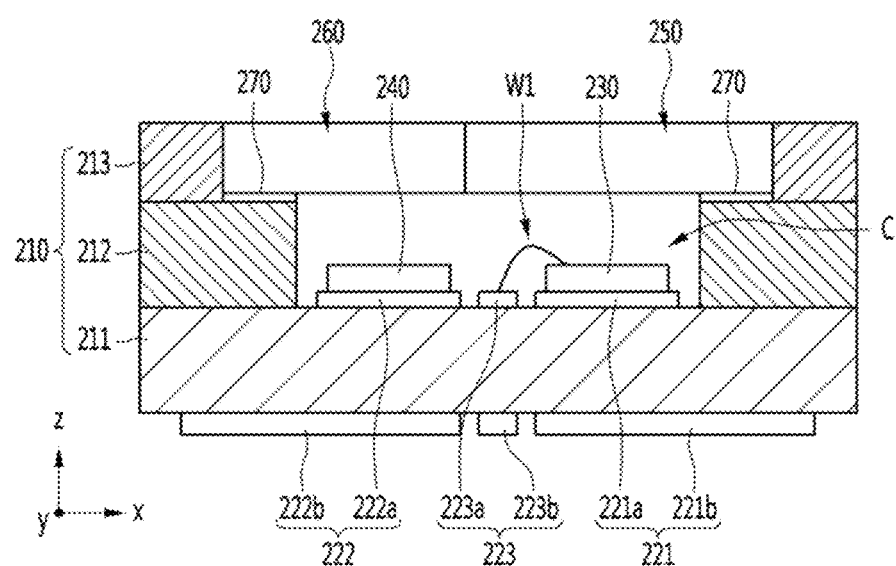

[Figure 16b]
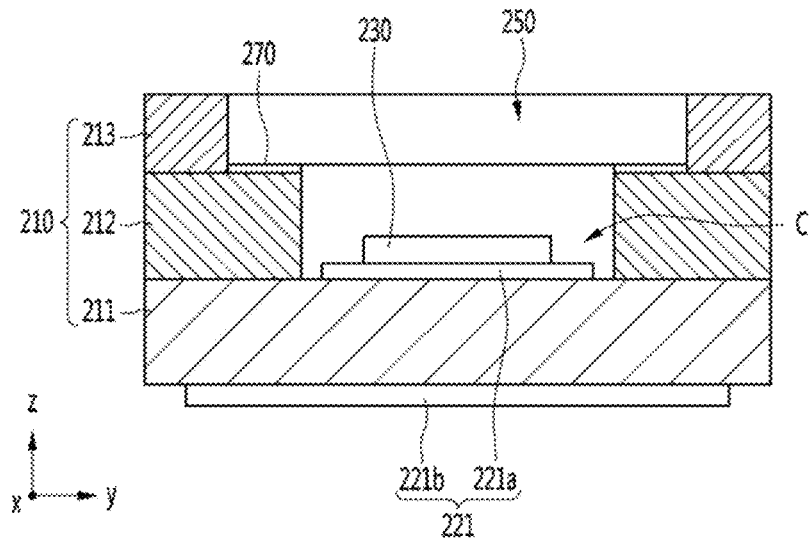
[Figure 17]
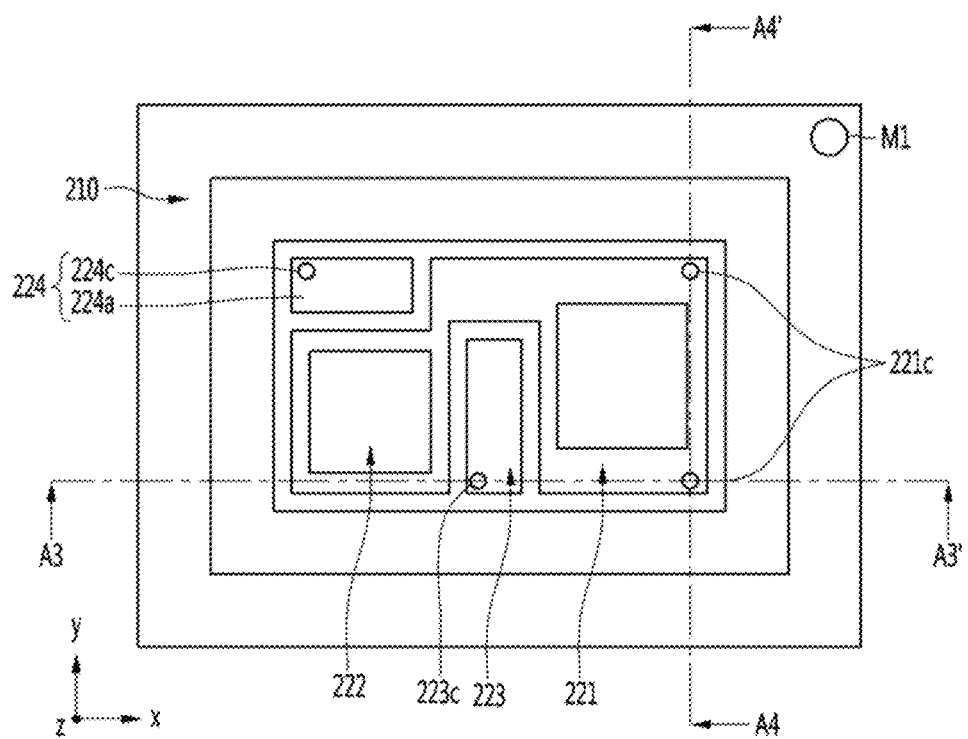

[Figure 18a]
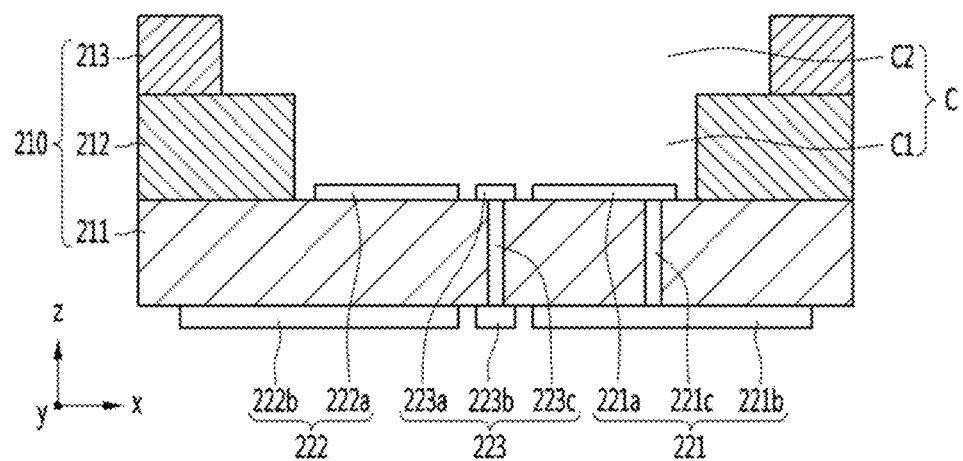
[Figure 18b]
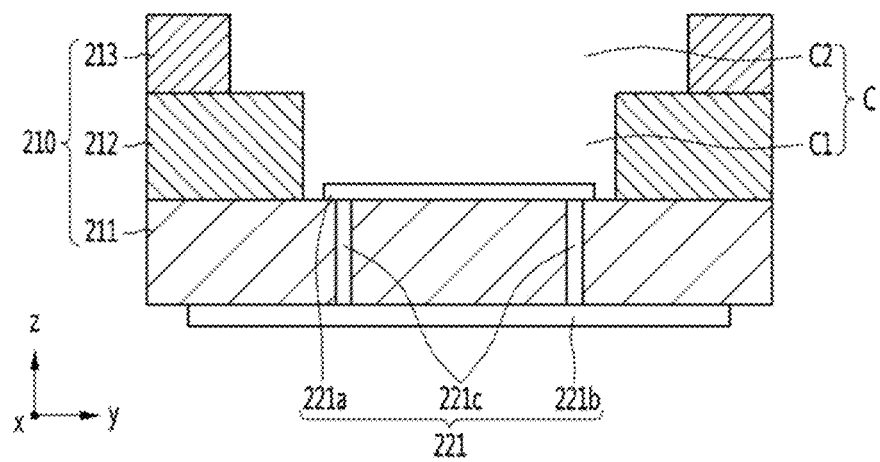

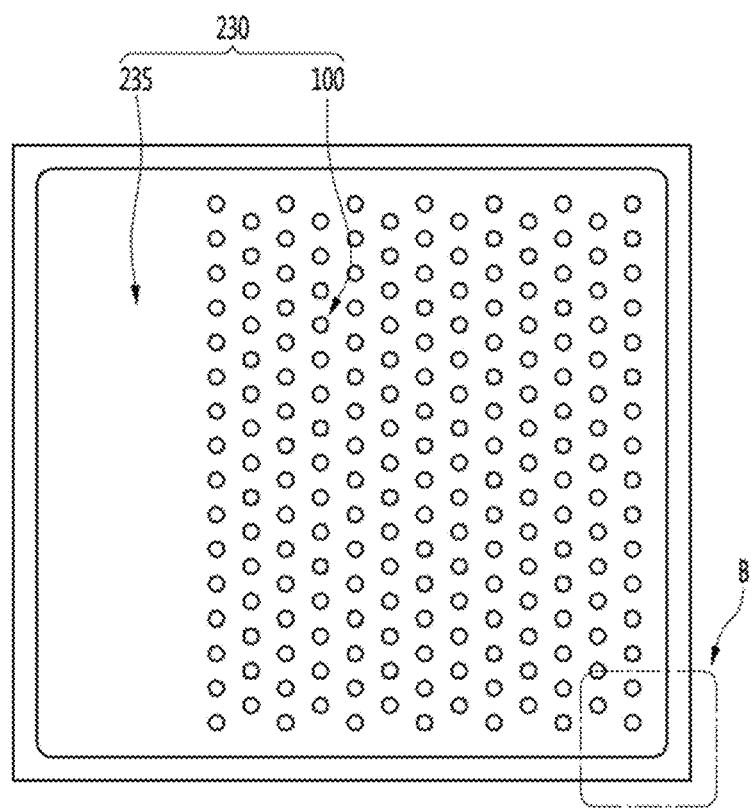
[Figure 19]

[Figure 20]
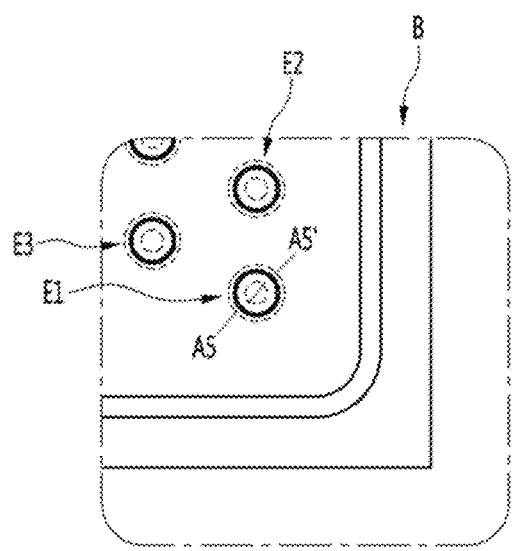

[Figure 21]
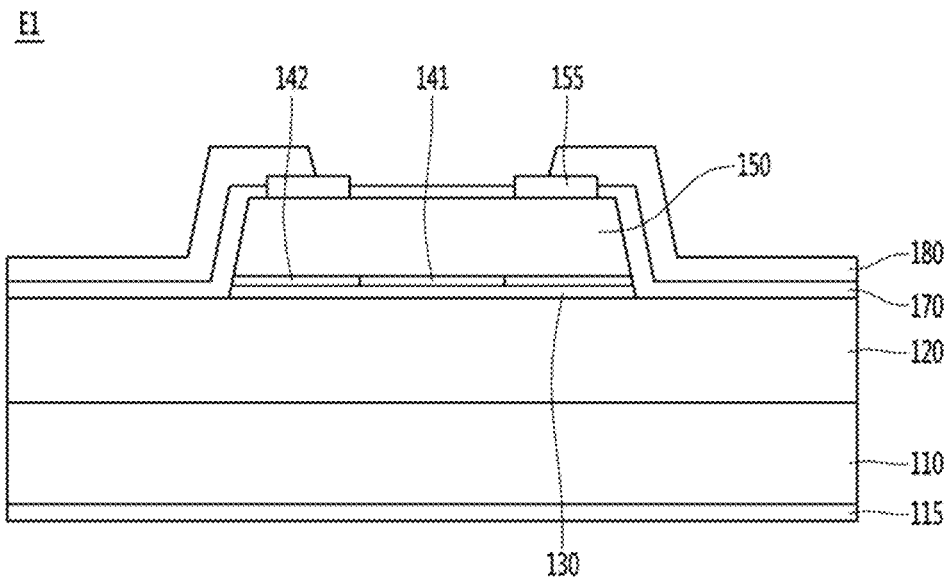
[Figure 22a]
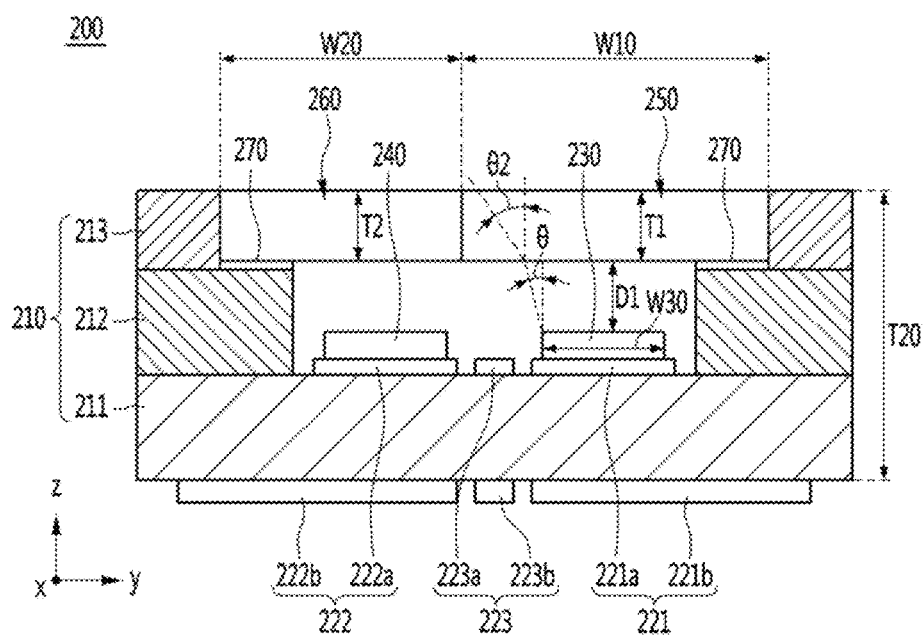

[Figure 22b]
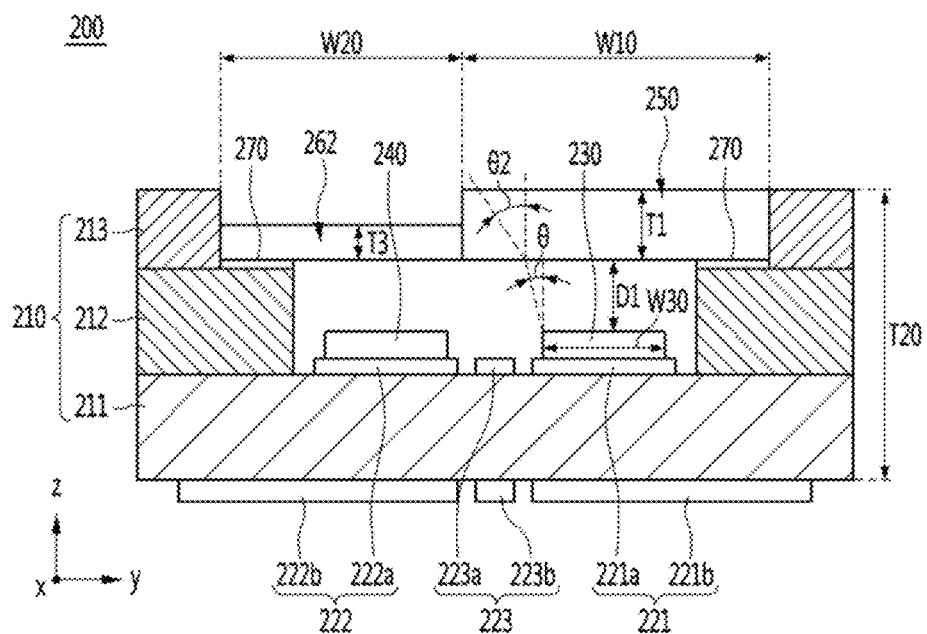

[Figure 23a]
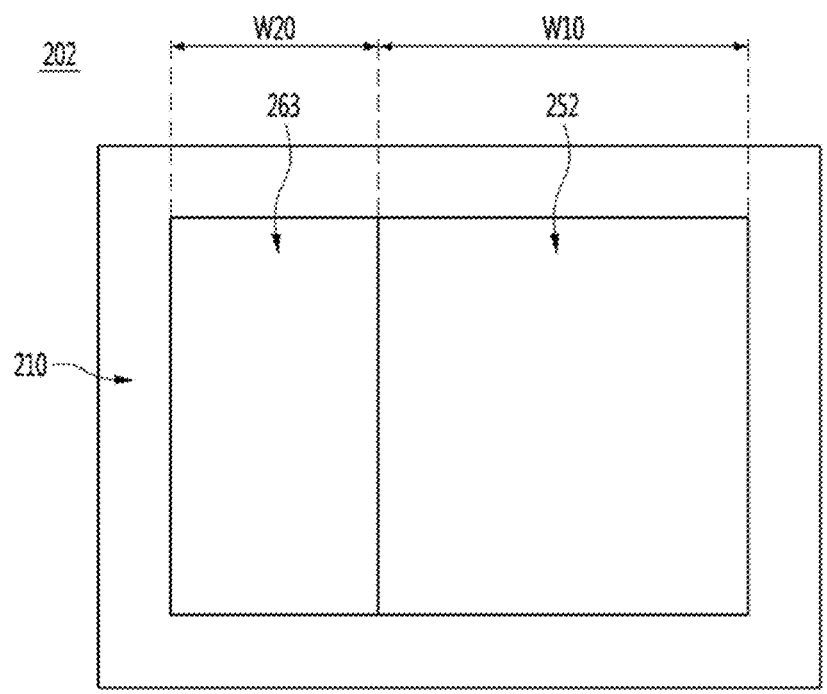

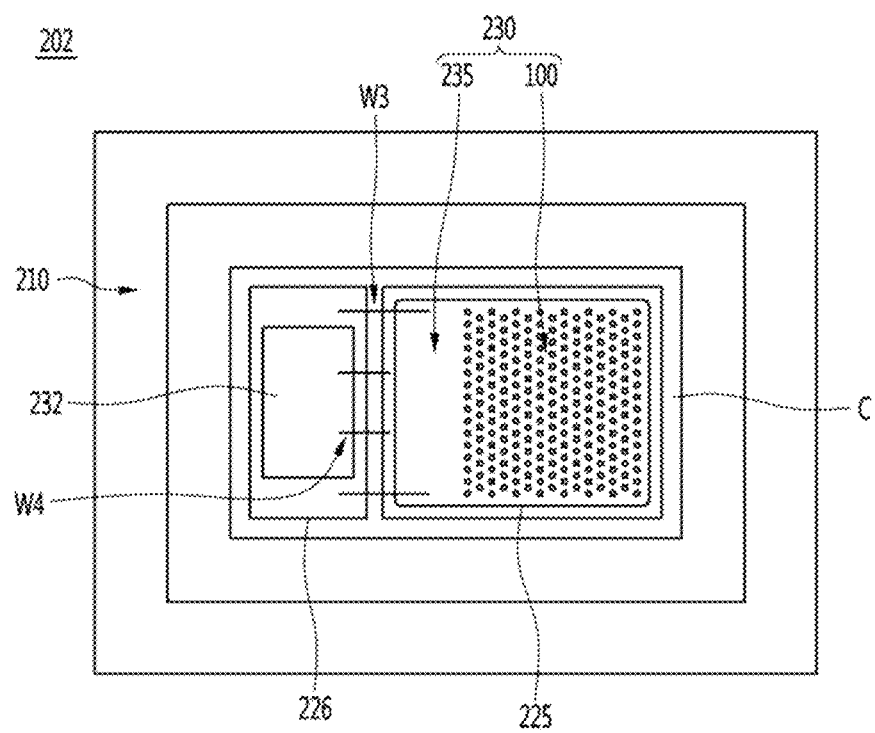
[Figure 23b]

[Figure 24]
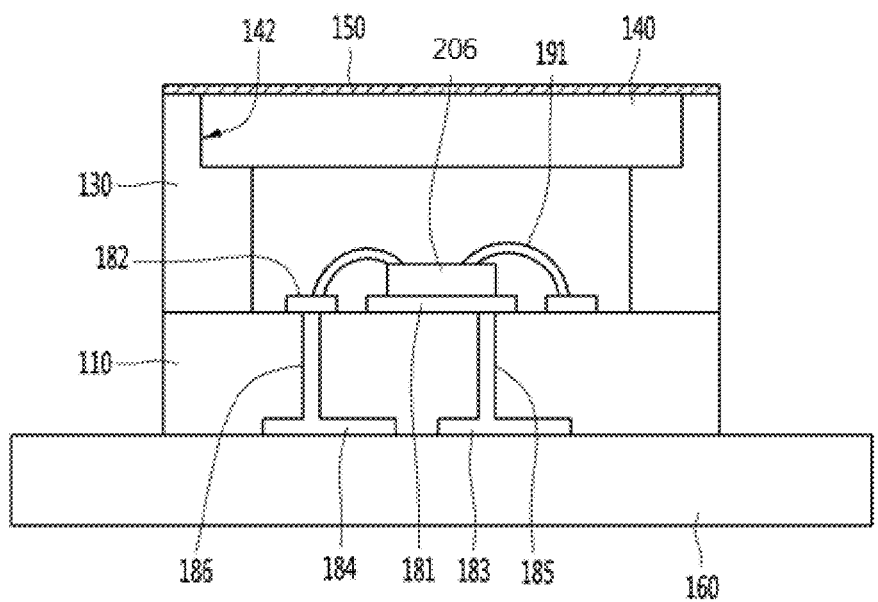

[Figure 25]
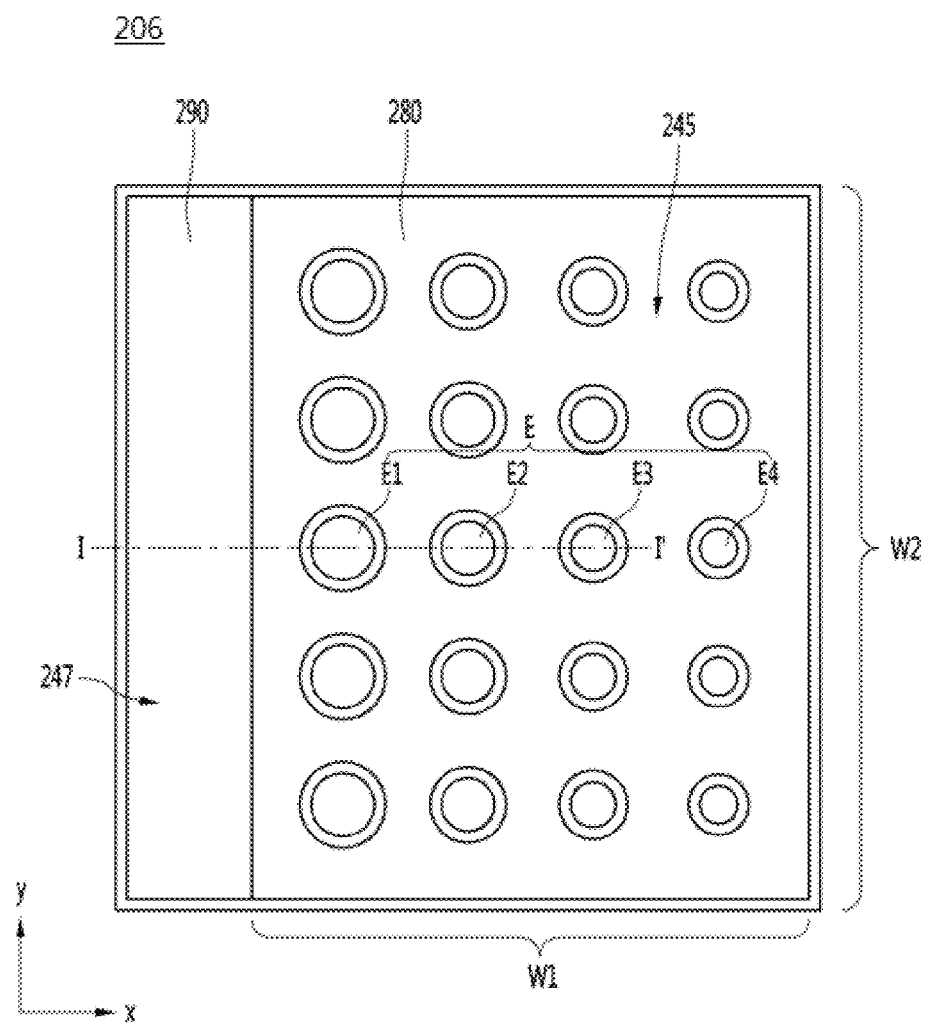

[Figure 26]
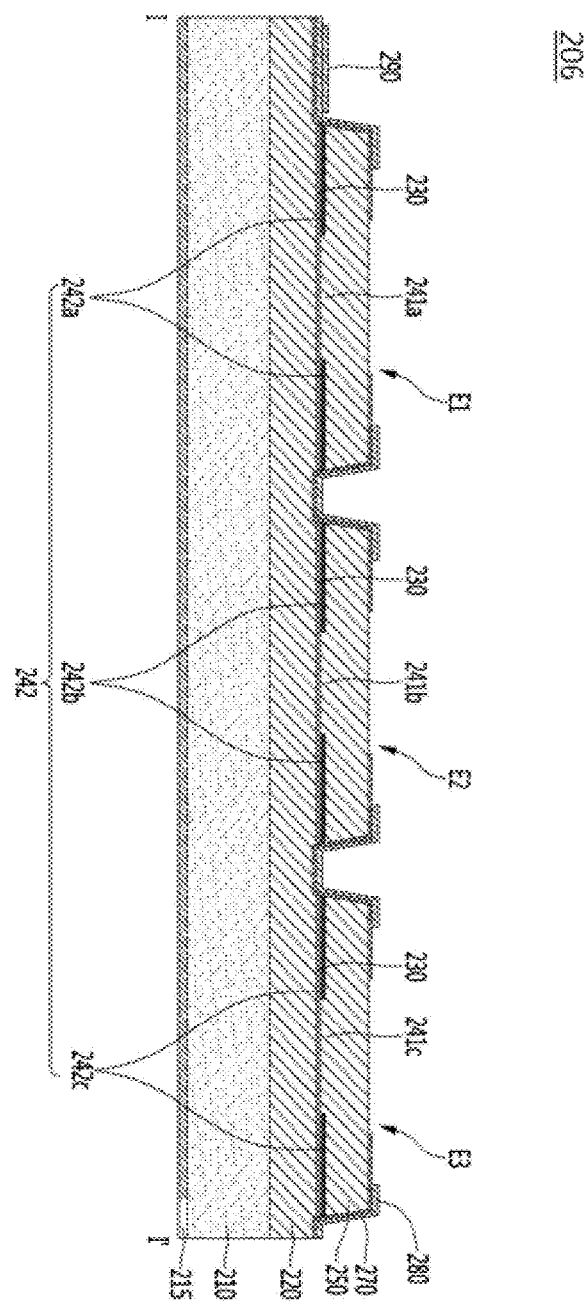

[Figure 27a]
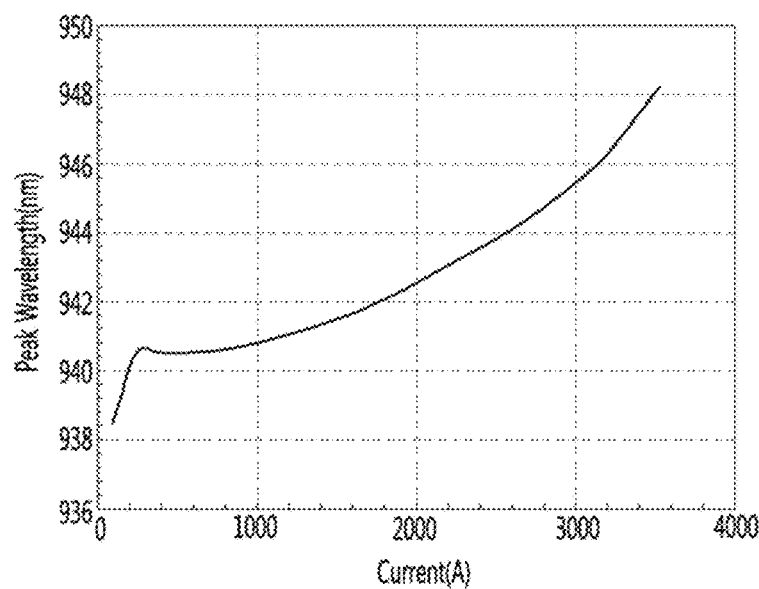
[Figure 27b]
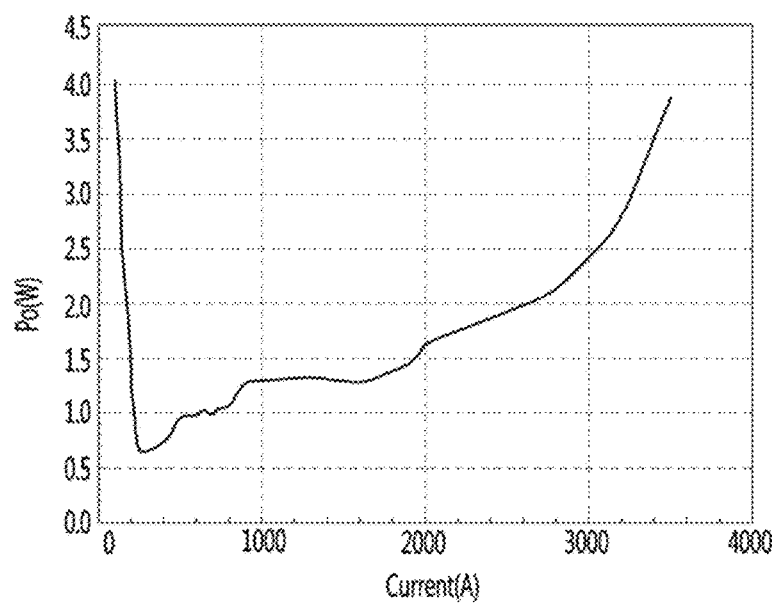

[Figure 27c]
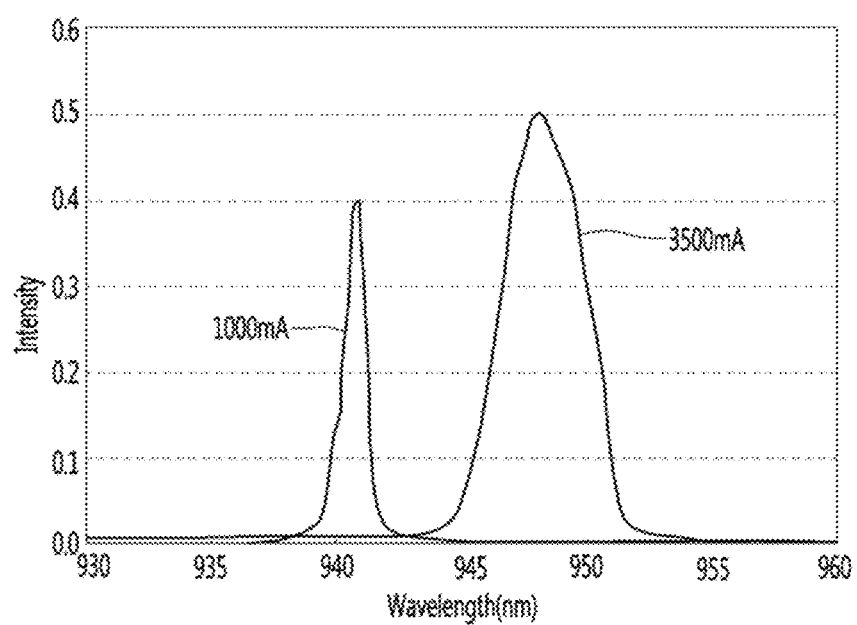

[Figure 28]
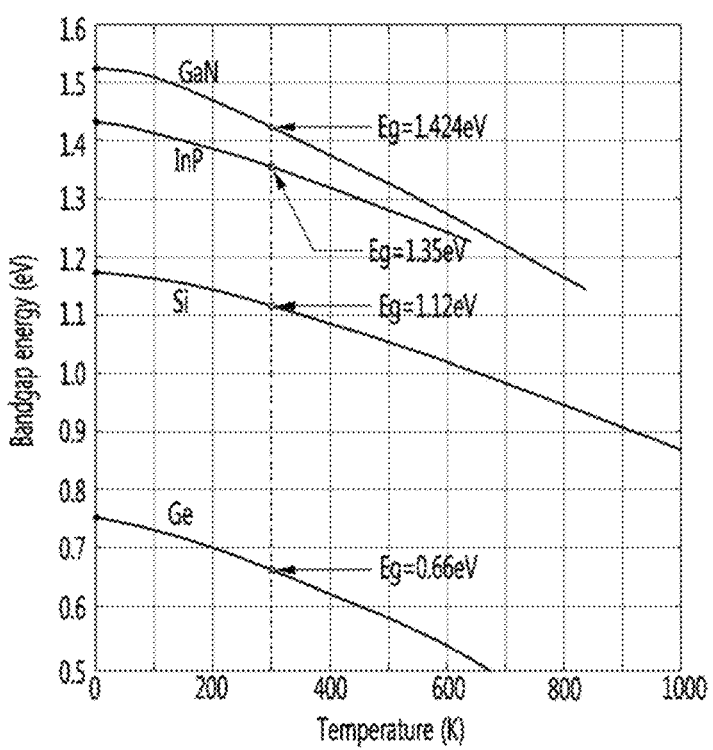

[Figure 29]
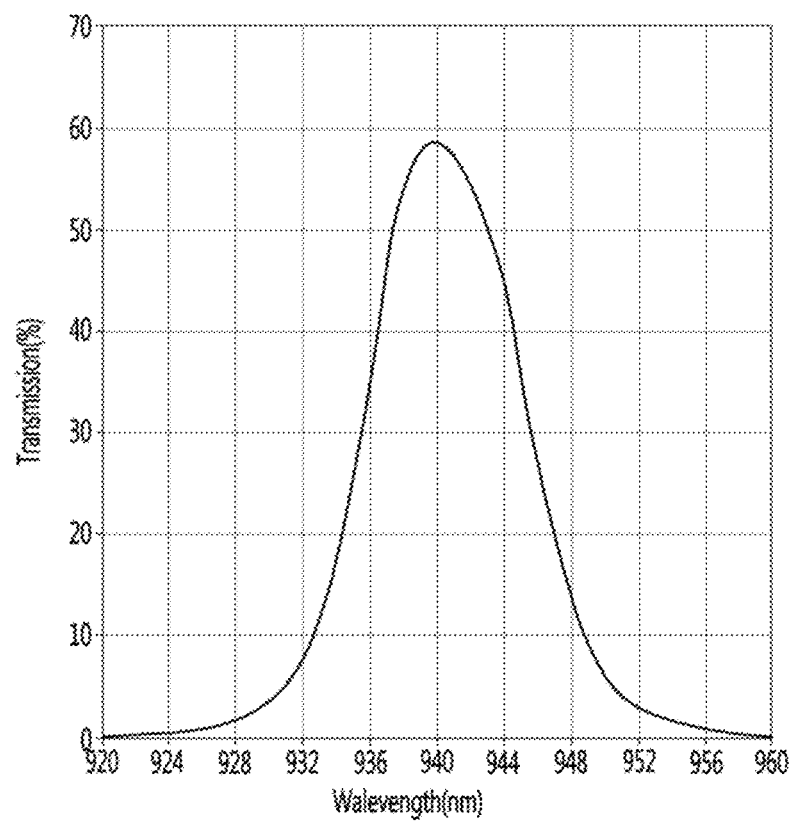

[Figure 30]
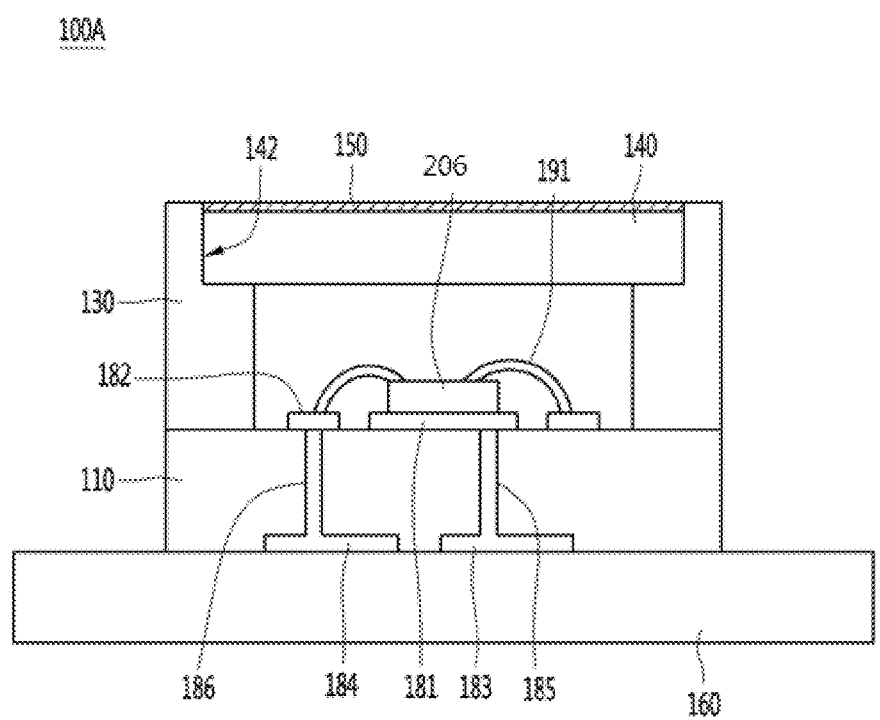

[Figure 31]
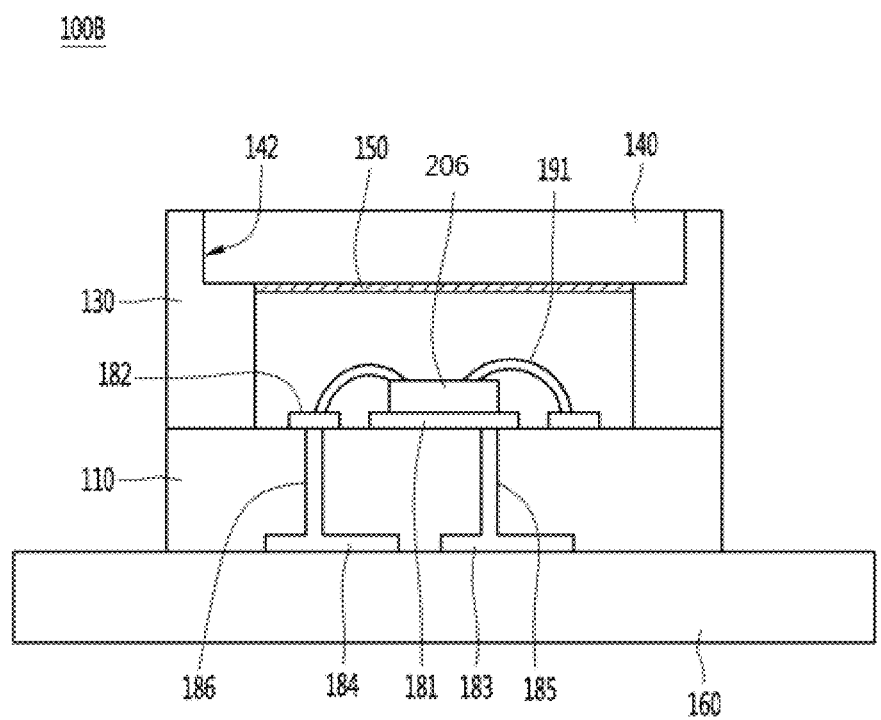

[Figure 32]
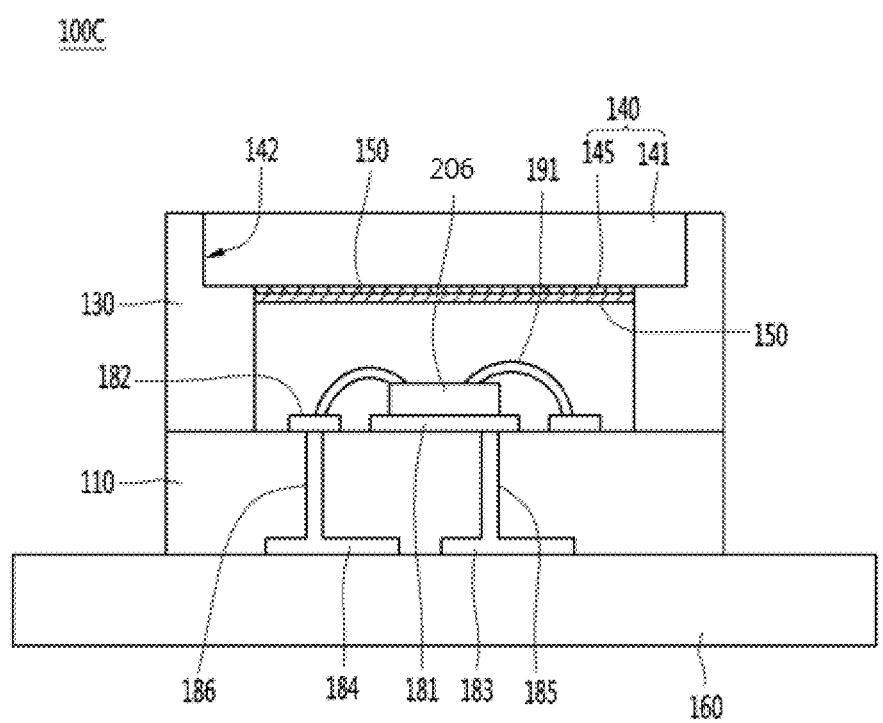

[Figure 33]
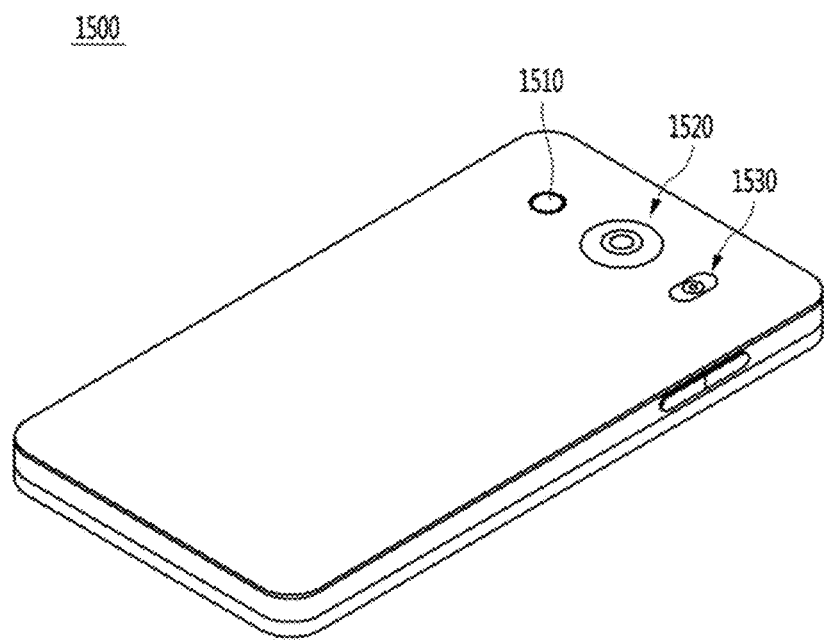

SURFACE EMITTING LASER PACKAGE HAVING A DIFFUSION PART HAVING GLASS AND POLYMER LAYERS AND LIGHT EMITTING DEVICE INCLUDING THE SAME

CROSS REFERENCE TO RELATED APPLICATIONS

This application is the National Phase of PCT International Application No. PCT/KR2019/005696, filed on May 13, 2019, which claims priority under 35 U.S.C. 119 (a) to Patent Application Nos. 10-2018-0054094, filed in the Republic of Korea on May 11, 2018, 10-2018-0058068, filed in the Republic of Korea on May 23, 2018, and 10-2018-0100264, filed in the Republic of Korea on Aug. 27, 2018, all of which are hereby expressly incorporated by reference into the present application.

TECHNICAL FIELD

The embodiment relates to a surface emitting laser package and a light emitting device including the same.

BACKGROUND ART

A semiconductor device including a compound such as GaN or AlGaN has many advantages, such as having a wide and easily adjustable band gap energy, and thus can be used in various ways as a light emitting device, a light receiving device, and various diodes.

In particular, light emitting devices such as light emitting diodes and laser diodes using a group III-V or II-VI compound semiconductor material of semiconductors can be implemented various colors such as blue, red, green, and ultraviolet light. In addition, it is possible to implement highly efficient white light rays by using fluorescent materials or by combining colors. In addition, it has advantages of low power consumption, semi-permanent life, fast response speed, safety and environmental friendliness compared to conventional light sources such as fluorescent lamps and incandescent lamps.

In addition, when light receiving devices such as photodetectors and solar cells are also manufactured using compound semiconductor materials of Groups III-V or II-VI of semiconductors, the development of device materials generates photocurrent by absorbing light in various wavelength ranges. By doing so, light in various wavelength ranges from gamma rays to radio wavelength ranges can be used. In addition, it has the advantages of fast response speed, safety, environmental friendliness, and easy control of device materials, so it can be easily used for power control or ultra-high frequency circuits or communication modules.

Accordingly, a light emitting diode backlight is replacing a cold cathode fluorescent lamp (CCFL) constituting a transmission module of an optical communication means and a backlight of a liquid crystal display (LCD) display device. Applications are expanding to white light emitting diode lighting devices that can replace fluorescent or incandescent bulbs, automobile headlights and traffic lights, and sensors that detect gas or fire.

In addition, applications can be extended to high-frequency application circuits, other power control devices, and communication modules. For example, in the conventional semiconductor light source device technology, there is a vertical-cavity surface emitting laser (VCSEL), which is used for optical communication, optical parallel processing, and optical connection. On the other hand, in the case of a laser diode used in such a communication module, it is designed to operate at a low current.

Surface emitting laser devices are being developed for communication and sensors. Surface emitting laser devices for communication are applied to optical communication systems.

The surface emitting laser device for sensors is applied to 3D sensing cameras that recognize human faces. For example, a 3D sensing camera is a camera capable of capturing depth information of an object, and has recently been in the spotlight in conjunction with augmented reality.

On the other hand, for sensing the depth of the camera module, a separate sensor is mounted, and it is divided into two types such as Structured Light (SL) method and ToF (Time of Flight) method.

In the structured light (SL) method, a laser of a specific pattern is radiated onto a subject, and the depth is calculated by analyzing the degree of deformation of the pattern according to the shape of the subject surface, and then combining it with a picture taken by an image sensor to obtain a 3D photographing result.

In contrast, the ToF method is a method in which a 3D photographing result is obtained by calculating the depth by measuring the time the laser reflects off the subject and returning it, and then combining it with the picture taken by the image sensor.

Accordingly, the SL method has an advantage in mass production in that the laser must be positioned very accurately, while the ToF technology relies on an improved image sensor, and it is possible to adopt either method or both methods in one mobile phone.

For example, a 3D camera called True Depth can be implemented in a front of a mobile phone in the SL method, and the ToF method can be applied in the rear thereof.

Such a surface emitting laser device can be commercialized as a surface emitting laser package. In a conventional surface emitting laser package, a diffusion part is disposed on the surface emitting laser device to diffuse the laser beam of the surface emitting laser device, and it is fixed by an adhesive member thereon.

However, even if the diffusion part is fixed by the adhesive member, a problem occurs in that the diffusion part is detached by impact. When the diffusion part is detached in this way, the laser beam emitted from the surface emitting laser device disposed under the diffusion part is exposed as it is. When the surface emitting laser package is applied to the field of facial recognition, there is a risk of blindness due to the exposure of the laser beam being transmitted to the user's eyes by the detachment and detachment of the diffusion part, so there is an issue of eye safety.

In particular, in the related art, the diffusion part includes a glass layer and a polymer layer. However, as the glass layer and the polymer layer have different coefficients of thermal expansion, there is a problem that peeling occurs in reliability tests such as a thermal shock or a thermal cycle test. The problem of delamination of the diffusion part causes a technical problem that cannot guarantee eye safety.

In addition, in the conventional high-power VCSEL package structure, a diffusion part is used to form a constant divergence angle. However, there is a risk that a person may become blind if the laser of the VCSEL is directly irradiated to the human eye when the diffusion part is separated by an impact during use in a vehicle or mobile. Accordingly, there is a need for a study on a semiconductor device package that can prevent a strong laser from being directly incident on a person while being applied to a vehicle or applied to an application field such as a movement of a person.

In addition, in the related art, as the application fields of semiconductor devices are diversified, high output and high voltage driving are required, as well as miniaturization of semiconductor device packages is strongly requested for miniaturization of products.

Meanwhile, the divergence angle may be measured by a radiance measurement method and an irradiance measurement method.

In addition, in the related art, when heat is generated due to over-operation or malfunction of the driving circuit for driving the surface emitting laser package, the wavelength band of light of the surface emitting laser device of the surface emitting laser package may be shifted to a longer wavelength range. Since such a long wavelength range may damage the user's eyes, a solution to this is required.

DISCLOSURE

Technical Problem

One of the technical problems of the embodiment is to provide a surface emitting laser package having excellent reliability and a light emitting device including the same.

In addition, one of the technical problems of the embodiment is to provide a surface emitting laser package and an optical module that are excellent in reliability and stability and can safely protect an element disposed therein from external impact.

In addition, one of the technical problems of the embodiment is to provide a compact surface emitting laser package and an optical module capable of driving high power and high voltage.

In addition, one of the technical problems of the embodiment is to provide a surface emitting laser package and an auto-focusing device capable of protecting the user's eyes.

The technical problem of the embodiment is not limited to the content described in this item, and includes what is understood through the description of the invention.

Technical Solution

The surface emitting laser package according to the embodiment may include a housing including a cavity, a surface emitting laser device disposed in the cavity, and a diffusion part disposed on the housing.

The diffusion part may include a polymer layer and a glass layer disposed on the polymer layer.

The polymer layer may include a first polymer layer vertically overlapping the surface emitting laser device, and a second polymer layer not vertically overlapping the surface emitting laser device.

The thickness T2a of the first polymer layer may be thinner than the thickness T2b of the second polymer layer.

The ratio (T2b/T1) of thickness T2b the of the second polymer layer 146b to the first thickness T1 of the glass layer 141 may range from 0.12 to 3.0.

The embodiment may further include an adhesive member 155 between the housing and the polymer layer.

The thermal expansion coefficient of the adhesive member 155 may be in the range of 1 to 2 times the thermal expansion coefficient of the polymer layer 146.

The surface emitting laser package according to the embodiment includes a housing including a cavity, a surface emitting laser device disposed in the cavity, and a diffusion part disposed on the housing. The diffusion part may include a polymer layer disposed on a housing on the surface emitting laser device and a glass layer disposed on the polymer layer.

A ratio (T2/T1) of the second thickness (T2) of the polymer layer to the first thickness (T1) of the glass layer may range from 0.12 to 3.0.

The embodiment may further include an adhesive member between the housing and the polymer layer.

The thermal expansion coefficient of the adhesive member 155 may be in the range of 1 to 2 times the thermal expansion coefficient of the polymer layer.

The surface emitting laser package according to the embodiment includes a body 210 including a cavity (C); a surface emitting laser device 230 disposed inside the cavity C; a light receiving device 240 disposed in the cavity C to be spaced apart from the surface emitting laser device 230 and configured to sense light emitted from the surface emitting laser device 230; and diffusion parts 250 and 260 disposed on the body 210, a transmissive part 250 and a reflective part 260, wherein the transmissive part 250 is disposed on the surface emitting laser device 230.

The reflective part 260 may be disposed on the light receiving device 240. The second width W20 of the reflective part 260 may be narrower than the first width W10 of the transmissive part 250. The reflective part 260 may not be overlapped with a divergence angle of the surface emitting laser device 230.

In an embodiment, the second width W20 of the reflective part 260 may be narrower than the first width W10 of the transmissive part 250.

The first width W10 of the transmission part 250 may be wider than a divergence angle of the surface emitting laser device 230.

The reflective part 260 may not be overlapped with a divergence angle of the surface emitting laser device 230.

An embodiment includes a first electrode part 221 on which the surface emitting laser device is disposed; a second electrode part 222 on which the light receiving device 240 is disposed; a third electrode part 223 electrically connected to the surface emitting laser device by a first wire W1; and a fourth electrode part 224 electrically connected to the light receiving device 240 and the second wire W2.

In the embodiment, the first separation distance D1 from the top surface of the surface emitting laser device 230 to the transmission part 250 may be in the range of 2/75 to ⅕ of the third horizontal width W30 of the surface emitting laser device 230.

The first horizontal width W10 of the transmission part 250 may be in the range of 18/15 to 6 times the third horizontal width W30 of the surface emitting laser device 230.

The second horizontal width W20 of the reflector 260 may range from 16/15 times to 4 times the horizontal width of the light receiving device 240.

The thickness T3 of the reflective part 262 may be thinner than the thickness T1 of the transmissive part 250.

The thickness T3 of the reflective part 262 may range from ⅒ to ½ of the thickness T1 of the transmissive part 250.

The thickness T3 of the reflective part 262 may be in the range of ⅕ to 1 times the third horizontal width W30 of the surface emitting laser device 230.

In addition, the surface emitting laser package according to the embodiment includes a body 210 including a cavity (C); a fifth electrode part 225 and a sixth electrode part 226 spaced apart from each other in the cavity C;

a surface emitting laser device 230 disposed on the fifth electrode part 225 and electrically connected to the sixth electrode part 226 and a third wire W3; a second light receiving device spaced apart from the surface emitting laser device 230 in the cavity C and disposed on the sixth electrode part 226 to detect light emitted from the surface emitting laser device 230; and a diffusion part 252, 263 disposed on the body 210 and including a second transmission part 252 and a third reflection part 263; and the second transmission part 252 is disposed on the surface emitting laser device 230, the third reflecting part 263 is disposed on the second light receiving device 232, and the third reflection, and the portion 263 may not be overlapped with the divergence angle of the surface emitting laser device 230.

The optical module according to the embodiment may include the surface emitting laser package.

In addition, the surface emitting laser package according to the embodiment includes a substrate; a surface emitting laser device disposed on the substrate; a housing disposed around the surface emitting laser device; a diffusion part disposed on the surface emitting laser device; and a wavelength limiting member disposed on the surface emitting laser device. The surface emitting laser device may emit light having a first wavelength band. The wavelength limiting member may block a wavelength of the light outside the first wavelength band.

In addition, the auto-focusing device according to the embodiment includes the surface emitting laser package; and a light-receiving unit receiving the reflected light of the light emitted from the surface emitting laser package.

Advantageous Effects

According to the embodiment, there is a technical effect of providing a surface emitting laser package having excellent reliability by preventing peeling of the diffusion part and a light emitting device including the same.

For example, the embodiment may control a ratio (T2/T1) of the second thickness T2 of the polymer layer 145 as the second layer to the first thickness (T1) of the glass layer 141 as the first layer. Through this, even if the glass layer 141 and the polymer layer 145 have different coefficients of thermal expansion, relative stress can be controlled to be low. Therefore, the embodiment has a technical effect that can exhibit excellent performance in a reliability test such as a thermal shock or a heat cycle test.

In addition, in the embodiment, by controlling the first thickness T2a of the first polymer layer 146a to be thinner than the second thickness T2b of the second polymer layer 146b, it is vertically overlapped with the surface emitting laser device 201. Optical properties may be improved by increasing the light transmittance of the first polymer layer 146a.

Also, at the same time, the second thickness T2b of the second polymer layer 146b not vertically overlapping the surface emitting laser device 201 is thicker than the first thickness T2a of the first polymer layer 146a. At the same time, by controlling the thickness ratio (T2b/T1) of the glass layer 141 to the first thickness (T1) in the range of 0.12 to 3.0, there is a complex technical effect with excellent reliability against thermal stress.

In addition, according to an embodiment, the coefficient of thermal expansion between the polymer layer 146 and the adhesive member 155 is minimized by controlling the coefficient of thermal expansion of the adhesive member 155 in a range of 1 to 2 times that of the polymer layer 146 so that there is a technical effect that can greatly improve the reliability.

In addition, according to the embodiment, there is a technical effect of providing a surface emitting laser package and an optical module having excellent reliability and stability.

In addition, according to the embodiment, it is possible to provide a compact surface emitting laser package and an optical module while being capable of driving high output and high voltage.

In addition, according to an embodiment, since a wavelength limiting member is provided on the expansion unit and the housing, there is a technical effect in that it is possible to block light having a second wavelength band emitted from the surface emitting laser device due to an abnormal operation so that the user's eyes are not damaged.

In addition, according to the embodiment, since the wavelength limiting member is attached to the housing as well as the diffusion part, the separation of the diffusion part is prevented, so that the light from the surface emitting laser device is directly provided to the outside, thereby preventing damage to the user's eyes.

The technical effects of the embodiments are not limited to the contents described in this item, and include those identified through the description of the invention.

DESCRIPTION OF DRAWINGS

FIG. 1 is a cross-sectional view of a surface emitting laser package according to a first embodiment.

FIG. 2 is an enlarged view of a first area in the surface emitting laser package according to the first embodiment.

FIG. 3 is a photograph of a diffusion part in the surface emitting laser package according to the first embodiment.

FIG. 4 is a relative stress data according to the relative thickness of the glass layer and the polymer layer in the diffusion part of the surface emitting laser package according to the first embodiment.

FIG. 5 is a photograph of a reliability test result in a surface emitting laser package according to a comparative example and an example.

FIG. 6 is a cross-sectional view of a surface emitting laser package according to a second embodiment.

FIG. 7 is an enlarged view of a second area in the surface emitting laser package according to the second embodiment.

FIG. 8 is light absorption data according to a thickness in a polymer layer of a diffusion part in the surface emitting laser package according to the second embodiment.

FIG. 9 is a photograph of a reliability test result in a surface emitting laser package according to Comparative Examples 2, 3, and third embodiment;

FIG. 10 is a plan view of a surface emitting laser device according to an embodiment.

FIG. 11 is an enlarged view of a region C1 of the surface emitting laser device according to the embodiment shown in FIG. 10.

FIG. 12 is a cross-sectional view taken along line A1-A2 of the surface emitting laser device according to the embodiment shown in FIG. 11.

FIG. 13 is another cross-sectional view of a surface emitting laser device according to an embodiment.

FIG. 14 is a plan view of a surface emitting laser package according to a fourth embodiment.

FIG. 15 is a plan view in which a diffusion part and a reflector are omitted in the surface emitting laser package according to the fourth embodiment shown in FIG. 14.

FIG. 16A is a cross-sectional view taken along line A1-A1' of the surface emitting laser package 200 according to the fourth embodiment shown in FIGS. 14 and 15.

FIG. 16B is a cross-sectional view taken along line A2-A2' of the surface emitting laser package 200 according to the fourth embodiment shown in FIGS. 14 and 15.

FIG. 17 is a plan view in which a light emitting device and a light receiving device are omitted in the surface emitting laser package according to the fourth embodiment shown in FIG. 16.

FIG. 18A is a cross-sectional view taken along line A3-A3' of the surface emitting laser package according to the fourth embodiment shown in FIG. 17;

FIG. 18B is a cross-sectional view taken along line A4-A4' of the surface emitting laser package according to the fourth embodiment shown in FIG. 17;

FIG. 19 is a plan view of a surface emitting laser device in a surface emitting laser package according to an embodiment.

FIG. 20 is a partially enlarged view of a region B of the surface emitting laser device in the surface emitting laser package according to the embodiment shown in FIG. 19.

FIG. 21 is a cross-sectional view taken along line A5-A5' of a first emitter of the surface emitting laser device of the surface emitting laser package according to the embodiment shown in FIG. 20;

FIG. 22A is a detailed cross-sectional view of the surface emitting laser package according to the fourth embodiment shown in FIG. 16A and a first wire is omitted.

FIG. 22B is a view in which the thickness of the reflective portion is thinner than the thickness of the transmission portion in the surface emitting laser package according to the fourth embodiment shown in FIG. 22A.

FIG. 23A is a plan view of a surface emitting laser package according to a fifth embodiment.

FIG. 23B is a view in which a second transmission part and a third reflection part are omitted in the surface emitting laser package according to the fifth embodiment shown in FIG. 23A.

FIG. 24 is a cross-sectional view illustrating a surface emitting laser package according to a sixth embodiment.

FIG. 25 is a plan view of a surface emitting laser device according to a sixth embodiment.

FIG. 26 is a cross-sectional view taken along line I-I' of the surface emitting laser device according to the sixth embodiment shown in FIG. 25.

FIG. 27 shows a state in which the peak wavelength of light is shifted according to the current.

FIG. 28 shows a change in bandgap energy according to temperature.

FIG. 29 shows the peak wavelength according to the wavelength of the wavelength limiting member.

FIG. 30 is a cross-sectional view illustrating a surface emitting laser package according to a seventh embodiment.

FIG. 31 is a cross-sectional view illustrating a surface emitting laser package according to an eighth embodiment.

FIG. 32 is a cross-sectional view illustrating a surface emitting laser package according to a ninth embodiment.

FIG. 33 is a perspective view of a mobile terminal to which a surface emitting laser device is applied according to an embodiment.

MODE FOR INVENTION

Hereinafter, embodiments that can be implemented specifically for solving the above problems will be described with reference to the accompanying drawings.

In the description of the embodiment, what is described as being formed in "on or under" of each element includes both elements that are in direct contact with each other or that one or more other elements are arranged indirectly between the two elements. In addition, what is expressed as "on or under" may include not only an upward direction but also a downward direction based on one element.

In an embodiment, the surface emitting laser package may be referred to as a surface emitting laser package or a surface light emission laser package.

Hereinafter, the first to ninth embodiments will be described, but each embodiment is not independent from each other, and can be combined with each other within a range compatible with each other to solve the technical problem of the applied invention, and this will implement the technical effect of the applied invention First Embodiment FIG. 1 is a cross-sectional view showing a surface emitting laser package 100 according to a first embodiment, and FIG. 2 is an enlarged view of a first region D1 in the surface emitting laser package according to the first embodiment.

Referring to FIG. 1, the surface emitting laser package 100 according to the first embodiment may include a housing 110, a surface emitting laser device 201, and a diffusion part 140. For example, the surface emitting laser package 100 according to the first embodiment includes a housing 110 having a cavity C, a surface emitting laser device 201 disposed in the cavity C, and a diffusion part 140 disposed on the housing 110.

Hereinafter, a surface emitting laser package 100 according to a first embodiment will be described with reference to FIGS. 1 to 5.

In the surface emitting laser package 100 according to the embodiment, the housing 110 may support the surface emitting laser device 201 and the diffusion part 140 disposed thereon. The housing 130, the surface emitting laser device 201, and the diffusion part 140 may be modules modularized by a packaging process. One or a plurality of such modules may be mounted on a circuit board (not shown).

The housing 110 of the embodiment may include a material having excellent support strength, heat dissipation, insulation, and the like. The housing 110 may include a material having high thermal conductivity. In addition, the housing 110 may be made of a material having good heat dissipation properties so that heat generated from the surface emitting laser device 201 can be efficiently discharged to the outside.

In addition, the housing 110 may include an insulating material. For example, the housing 110 may include a ceramic material. The housing 110 may include a low temperature co-fired ceramic (LTCC) or a high temperature co-fired ceramic (HTCC). In addition, the housing 110 may be provided with a silicone resin, an epoxy resin, a thermosetting resin including a plastic material, or a high heat resistance material.

In addition, the housing 110 may include a metal compound. The housing 110 may include a metal oxide having a thermal conductivity of 140 W/mK or more. For example, the housing 110 may include aluminum nitride (AlN) or alumina ($Al_2O_3$). In addition, the housing 110 may include a conductive material. When the housing 110 is formed of a conductive material such as metal, an insulating member for electrical insulation may be provided between the housing 110 and the surface emitting laser device 201 or between the housing 110 and the first to sixth electrode parts 181 to 186 described later.

The housing 110 may have a square shape when viewed from above, but is not limited thereto.

With continued reference to FIG. 1, the housing 110 of the embodiment may include a single body or a plurality of bodies. For example, the housing 110 may include a first body 110a, a second body 110b, and a third body 110c. The second body 110b may be disposed on the first body 110a, and the third body 110c may be disposed on the second body 110b.

The first body 110a to the third body 110c may be made of the same material and formed integrally. Meanwhile, the first to third bodies 110a to 110c may be formed of different materials and may be formed by separate processes. For example, the second to third bodies 110b to 110c are made of the same material and are integrally formed, and the first body 110a is made of a material different from the second to third bodies 110b to 110c. In this case, the lower surfaces of the integrally formed second to third bodies 110b to 110c and the upper surfaces of the first body 110a may be adhered to each other by an adhesive member (not shown). For example, the adhesive member may include any one or more of an organic material, an epoxy resin, or a silicone resin.

Next, the surface emitting laser package 100 according to the embodiment may include a first electrode part 181 and a second electrode part 182. The first electrode part 181 and the second electrode part 182 may be disposed in the housing 110. Specifically, the first electrode part 181 and the second electrode part 182 may be disposed to be spaced apart from each other on the upper surface of the first body 110a.

In the embodiment, the surface emitting laser device 201 may be disposed on the first electrode part 181. The surface emitting laser device 201 may be disposed on a partial area of the first electrode part 181. The size of the first electrode part 181 may be larger than the size of the surface emitting laser device 201. For example, the surface emitting laser device 201 may have a square shape when viewed from above, but this is not limited thereto.

The surface emitting laser device 201 may be electrically connected to the second electrode part 182 by a predetermined wire 187.

In addition, the embodiment may include a third electrode part 183 and a fourth electrode part 184 disposed to be spaced apart from the lower side of the first body 110a, and also include a fifth electrode part 185 and a sixth electrode part 186 penetrating the first body 110a.

The fifth electrode part 185 may electrically connect the first electrode part 181 and the third electrode part 183, and the sixth electrode part 186 may be electrically connect the second electrode part 182 and the fourth electrode part 184.

In the embodiment, the housing 110 may include a mounting part 110bt on which the diffusion part 140 is disposed. For example, a part of the upper surface of the second body 110b may function as the mounting part 110bt.

The embodiment may include an adhesive member 155 disposed between the mounting part 110bt of the housing 110 and the diffusion part 140. The adhesive member 155 can be formed by a material having excellent adhesion, moisture resistance, insulation, and support strength. For example, the adhesive member 155 may include one or more of an organic material, an epoxy resin, or a silicone resin.

Accordingly, the embodiment may provide a surface emitting laser package having excellent reliability by preventing detachment from the housing of the diffusion part and a light emitting device including the same.

Next, FIG. 2 is an enlarged view of a first area D1, for example, a diffusion part 140 in the surface emitting laser package 100 according to the first embodiment, and FIG. 3 is a picture of the diffusion part 140 of the surface emitting laser package according to the first embodiment.

Referring to FIG. 2, in the embodiment, the diffusion part 140 has a glass layer 141 having a first thickness T1 and a polymer layer 145 disposed on the glass layer 141 having a second thickness T2. Although the polymer layer 145 is shown to be disposed under the glass layer 141 in FIG. 2, the polymer layer 145 may be disposed above the glass layer 141 in the manufacturing process by a printing process. According to FIG. 2, the polymer layer 145 may include a pattern including a curved surface, and the pattern may be regular or irregular. In addition, the pattern may not be present at a portion where the adhesive member 155 to be described later is in contact, and may be formed on a relatively flat surface than the pattern.

As described above, in the related art, since the glass layer and the polymer layer constituting the diffusion part have different coefficients of thermal expansion, they are used in reliability tests such as thermal shock or thermal cycle test and there is a technical problem that cannot guarantee eye safety due to the delamination of the diffusion part.

FIG. 4 is a relative stress ($\sigma/\sigma T$) data according to the relative thickness ratio (T2/T1) between the glass layer 141 and the polymer layer 145, which are adjacent layers in the diffusion part 140 of the surface emitting laser package according to the first embodiment.

The embodiment can control the thickness ratio (T2/T1) of the first layer, the glass layer 141 and the second layer, the polymer layer 145, so that even if they have different coefficients of thermal expansion, there are technical effects that can show performance in that embodiment is excellent in reliability tests such as thermal shock or thermal cycle test.

For example, referring to FIG. 4, in the embodiment, the ratio thickness (T2/T1) of the second thickness T2 of the polymer layer 145 as the second layer 2 compared to the first thickness T1 of the glass layer 141 as the first layer 1 may be controlled to be 0.12 to 3.0 (first range SE). Through this, the relative stress is controlled to a low range of $-0.4 < \sigma/\sigma T < 0.8$, so even if the glass layer 141 and the polymer layer 145 have different coefficients of thermal expansion, there is a technical effect in that excellent performance can represent in reliability tests such as thermal shock or thermal cycle test.

In this case, $\sigma$ is a stress at the top of the second layer of the polymer layer 145, and $\overline{\sigma}$ is the average stress in the second layer of the polymer layer 145 (average stress in layer 2). In FIG. 4, the $\Sigma$ value may have a value such as 10, 1, or 1/10 depending on the material.

Table 1 below shows reliability test result data in the surface emitting laser packages (Experimental Examples 1 to 3) according to Comparative Example 1 (reliability tests were conducted with 5 samples each).

In addition, FIG. 5 is a photograph of the reliability test results in the surface emitting laser package according to Comparative Example 1 and Experimental Examples. Specifically, FIG. 5 (a) is a photograph of Comparative Example 1, and FIGS. 5 (b) to 5 (d) are photographs of the Experimental Examples 1~3.

TABLE 1

| | Glass layer thickness (T1) + polymer layer thickness (T2) (mm) [T2/T1] | Starting state | 200 cycle | 350 cycle | 500 cycle | 750 cycle |
|---|---|---|---|---|---|---|
| Comparative Example 1 | 0.7 + 0.08 [8/70 = 0.1143] | OK(5) | NG(2) | NG(5) | NG(5) | NG(5) |
| Experimental Example 1 | 0.28 + 0.08 [8/28 = 0.286] | OK(5) | OK(5) | OK(5) | OK(5) | OK(5) |
| Experimental Example 2 | 0.2 + 0.1 [10/20 = 0.5] | OK(5) | OK(5) | OK(5) | OK(5) | OK(5) |
| Experimental Example 3 | 0.4 + 0.05 [5/40 = 0.125] | OK(5) | OK(5) | OK(5) | OK(5) | OK(5) |

Referring to Table 1 and FIG. 5, in Comparative Example 1, total interface peeling occurred in the all five Diffuser raw materials from the 200 cycle. However, in Experimental Examples 1~3 according to embodiment, excellent reliability was exhibited without interfacial peeling even up to 7500 cycles.

According to an embodiment, the thickness ratio (T2/T1) of the second thickness T2 of the polymer layer 145, which is the second layer, to the first thickness T1 of the glass layer 141, which is the first layer, is a first range SE. By controlling thickness ratio to 0.12 to 3.0, the relative stress is controlled to be low, so that even if the glass layer 141 and the polymer layer 145 have different coefficients of thermal expansion, there is a technical effect in that the embodiment can show excellent performance in the same reliability during thermal shock test or thermal cycle test, etc.

In addition, according to an embodiment, the thickness ratio (T2/T1) of the second thickness T2 of the polymer layer 145, which is the second layer, to the first thickness T1 of the glass layer 141, which is the first layer, can be controlled as the first range (SE) such as 0.125 to 1.0.

In addition, according to an embodiment, the thickness ratio (T2/T1) of the second thickness T2 of the polymer layer 145, which is the second layer, to the first thickness T1 of the glass layer 141, which is the first layer, can be controlled to be 0.125 to 0.5 (first range SE).

In addition, in the embodiment, the first thickness T1 of the glass layer 141 can be controlled to be about 50 to 300 μm, and in the embodiment, the second thickness T2 of the polymer layer 145 can be controlled to be about 50 to 150 μm.

In the embodiment, the relative stress can be controlled to be low by controlling the thickness ratio (T2/T1) of the second thickness T2 of the polymer layer 145, which is the second layer, to the first thickness T1 of the glass layer 141, which is the first layer. Through this, even if the glass layer 141 and the polymer layer 145 have different coefficients of thermal expansion, there is a technical effect in that the embodiment can exhibit excellent performance in reliability tests such as thermal shock or thermal cycle test.

Second Embodiment

Next, FIG. 6 is a cross-sectional view of a surface emitting laser package 102 according to a second embodiment, and FIG. 7 is an enlarged view of a second area D2 in the surface emitting laser package according to the second embodiment. FIG. 8 is light absorption data according to the thickness of the polymer layer 146 of the diffusion part in the surface emitting laser package 102 according to the second embodiment.

The second embodiment can adopt the technical features of the first embodiment, and the main features of the second embodiment will be described below.

The surface emitting laser package 102 according to the second embodiment includes a housing 110 including a cavity C, a surface emitting laser device 201 disposed in the cavity C, and a diffusion part 140 disposed on the housing 110.

The diffusion part 140 includes a polymer layer 146 disposed on the housing 110 on the surface emitting laser device 201 and a glass layer 141 disposed on the polymer layer 146.

Referring to FIG. 7, the polymer layer 146 includes a first polymer layer 146a vertically overlapping with the surface emitting laser device 201 and a second polymer layer 146b not vertically overlapping the surface emitting laser device 201. A first thickness T2a of the first polymer layer 146a may be thinner than a second thickness T2b of the second polymer layer 146b.

FIG. 8 is light transmission data according to the thickness z of the polymer layer 146 in the surface emitting laser package 102 according to the second embodiment, and the degree of light absorption can be known.

For example, in FIG. 8, the horizontal axis represents the thickness z of the polymer layer 146, the vertical axis represents the light transmittance (I/I0) data, and a represents the absorption constant ($4\pi\lambda$).

Referring to FIG. 8, it can be seen that as the thickness z of the polymer layer 146 increases, the light transmittance (I/I0) of the vertical axis decreases exponentially as the light absorption increases.

Referring back to FIG. 7, in the second embodiment, the first thickness T2a of the first polymer layer 146a is controlled to be thinner than the second thickness T2b of the second polymer layer 146b. Optical properties may be improved by increasing the light transmittance in the first polymer layer 146a vertically overlapping the light emitting laser device 201.

Also, at the same time, the second thickness T2b of the second polymer layer 146b not vertically overlapping the surface emitting laser device 201 is thicker than the first thickness T2a of the first polymer layer 146a. At the same time, by controlling the thickness ratio (T2b/T1) of the glass layer 141 to the first thickness T1 in the range of 0.12 to 3.0, there is a complex technical effect with excellent reliability against thermal stress.

Also, referring to FIG. 7, in the second embodiment, the coefficient of thermal expansion (unit, ppm/° C.) of the adhesive member 155 may be controlled in a range of 1 to 2 times than the coefficient of thermal expansion of the polymer layer 146. Through this, reliability can be greatly improved by minimizing the coefficient of thermal expansion between the polymer layer 146 and the adhesive member 155.

For example, in the second embodiment, the coefficient of thermal expansion (unit, ppm/° C.) of the adhesive member 155 is controlled to be about 70 to 80 (ppm/° C.), and the coefficient of thermal expansion of the polymer layer 146 is controlled to be about 50 to 60. Through this, the thermal expansion coefficient of the adhesive member 155 is controlled to be in the range of 1 to 2 times than the thermal expansion coefficient of the polymer layer 146, so that the reliability between the polymer layer 146 and the adhesive member 155 can be greatly improved by minimizing the thermal expansion. In an embodiment, the material of the polymer layer may be a polyurethane acrylate series, but is not limited thereto.

Table 2 below shows reliability test result data for the surface emitting laser packages according to Comparative Example 2, Comparative Example 3, and Second Experimental example, and FIG. 9 is a surface emitting laser according to Comparative Example 2, Comparative Example 3, and Second Embodiment. This is a picture of the reliability test result on the package.

TABLE 2

| | No of Bonding surface of the Diffusion part | Starting state | 200 cycle | 350 cycle | 500 cycle | 750 cycle | 1000 cycle |
|---|---|---|---|---|---|---|---|
| Comparative Example 2 | Same | OK(5) | OK(5) | OK(5) | OK(5) | NG(5) | NG(5) |
| Comparative Example 3 | Same | OK(5) | OK(5) | NG(5) | NG(5) | NG(5) | NG(5) |
| Experimental Example 4 | Same | OK(5) | OK(5) | OK(5) | OK(5) | OK(5) | OK(5) |

Table 2 shows data from the reliability test results in the surface emitting laser package (Experimental Example 4) according to Comparative Example 2 and Comparative Example 3 and Second Embodiment (reliability tests were conducted with 5 samples each). In addition, FIG. 9 (*a*) is a photograph of Comparative Example 2, FIG. 9 (*b*) is a photograph of Comparative Example 3, and FIG. 9 (*c*) is a photograph of Experimental Example 4.

In Comparative Example 2, from the 750 cycle, all five Diffuser raw materials were completely separated from the interface. In particular, in Comparative Example 3, from 350 cycles, all five of the diffuser raw materials were completely separated from the interface. On the other hand, in Experimental Example 4 according to the second embodiment, excellent reliability was exhibited without interfacial peeling even up to 1,000 cycles.

In the second embodiment, the coefficient of thermal expansion of the adhesive member 155 may be controlled in a range of 1 to 2 times that of the polymer layer 146. Through this, the embodiment has a technical effect that can greatly improve reliability by minimizing the coefficient of thermal expansion between the polymer layer 146 and the adhesive member 155.

Next, the surface emitting laser device 201 will be described with reference to FIGS. 10 to 12.

FIG. 10 is a plan view of a surface emitting laser device according to an embodiment, and FIG. 11 is an enlarged view of a region C1 of the surface emitting laser device according to the embodiment shown in FIG. 10.

FIG. 12 is a cross-sectional view taken along line A1-A2 of the surface emitting laser device according to the embodiment shown in FIG. 11.

Referring to FIGS. 10 to 12, the surface emitting laser device 201 according to the embodiment may include a light emitting portion E and a pad portion P. As shown in FIG. 10, the light emitting portion E may be a region in which a laser beam is emitted as a region including a plurality of light emitting emitters E1, E2, and E3. For example, the light emitting portion E may include tens to hundreds of light emitting emitters. The pad portion P may be a region not disposed on the light emitting emitters E1, E2, and E3.

The surface emitting laser device 201 according to the embodiment may include a second electrode 282. That is, in each of the light emitting emitters E1, E2, and E3, the second electrode 282 may be disposed in a region other than the region corresponding to the aperture 241. For example, the second electrode 282 may be disposed in the second region of the second reflective layer 250. The first region of the second reflective layer 250 is surrounded by the second region and may be equal to or larger than the size of the opening 241. Accordingly, the beam generated by the emission layer 230 may pass through the opening 241 and be emitted to the outside through the opening defined by the second electrode 282.

Referring to FIG. 12, the surface emitting laser device 201 according to the embodiment includes at least one of a first electrode 215, a substrate 210, a first reflective layer 220, a light emitting layer 230, an oxide layer 240, and a second reflective layer 250, the passivation layer 270, and the second electrode 282.

The oxide layer 240 may include an opening 241 and an insulating region 242. The opening 241 may be a passage area through which current flows. The insulating region 242 may be a blocking region that blocks the flow of current. The insulating region 242 may be referred to as an oxide layer or an oxidation layer. The oxide layer 240 may be referred to as a current confinement layer because the oxide layer 240 limits the flow or density of the current so that the more concentrated laser beam is emitted.

The surface emitting laser device 201 according to the embodiment may further include a pad electrode 280. The pad electrode 280 may be disposed in a region other than the pad portion P, that is, except the light emitting portion E. The pad electrode 280 may be electrically connected to the second electrode 282. The first electrode 282 and the pad electrode 280 may be formed integrally or may be formed separately.

In the drawings of the embodiment, the direction of the x-axis may be a direction parallel to the length direction of the substrate 210, and the y-axis may be a direction perpendicular to the x-axis.

The surface emitting laser device 201 according to the embodiment provides a substrate 210. The substrate 210 may be a conductive substrate or a non-conductive substrate. A metal having excellent electrical conductivity may be used as the conductive substrate. Since heat generated during the operation of the surface emitting laser device 201 must be sufficiently dissipated, a GaAs substrate or a metal substrate having high thermal conductivity may be used as the conductive substrate, or a silicon (Si) substrate may be used. As the non-conductive substrate, an AlN substrate, a sapphire ($Al_2O_3$) substrate, or a ceramic-based substrate may be used.

The surface emitting laser device 201 according to the embodiment provides a first electrode 215. The first electrode 215 may be disposed under the substrate 210. The first electrode 215 may be formed of a conductive material and may be disposed in a single layer or multiple layers. For example, the first electrode 215 may be a metal, and includes at least one of aluminum (Al), titanium (Ti), chromium (Cr), nickel (Ni), copper (Cu), and gold (Au). Thus, it is formed in a single-layer or multi-layered structure, thereby improving the electrical properties and increasing the light output.

The surface emitting laser device 201 according to the embodiment provides a first reflective layer 220. The first reflective layer 220 may be disposed on the substrate 210. When the substrate 210 is omitted to reduce the thickness, the lower surface of the first reflective layer 220 may contact the upper surface of the first electrode 215.

The first reflective layer 220 may be doped with a first conductivity type dopant. For example, the first conductivity-type dopant may include an n-type dopant such as Si, Ge, Sn, Se, and Te.

The first reflective layer 220 may include a gallium-based compound, for example, AlGaAs, but is not limited thereto. The first reflective layer 220 may be a Distributed Bragg Reflector (DBR). For example, the first reflective layer 220 may have a structure in which a first layer and a second layer including materials having different refractive indices are alternately stacked at least once or more.

For example, the first reflective layer 220 may include a plurality of layers disposed on the substrate 210. Each layer may contain a semiconductor material having a composition formula of $Al_xGa_{(1-x)}As$ (0<x<1), and when Al in each layer increases, the refractive index of each layer decreases, and when Ga increases, the refractive index of can be increased. The thickness of each layer may be λ, λ may be a wavelength of light generated from the light emitting layer 230, and n may be a refractive index of each layer with respect to the light of the above-described wavelength. Here, λ may be 650 to 980 nanometers (nm), and n may be the refractive index of each layer. The first reflective layer 220 having such a structure may have a reflectance of 99.999% for light having a wavelength of about 940 nanometers.

The thickness of the layer in each of the first reflective layers 220 may be determined according to a respective refractive index and a wavelength 2 of light emitted from the light emitting layer 230.

The surface emitting laser device 201 according to the embodiment may include a light emitting layer 230. The emission layer 230 may be disposed on the first reflective layer 220. Specifically, the emission layer 230 may be disposed on the first reflective layer 220. The emission layer 230 may be disposed between the first reflective layer 220 and the second reflective layer 250.

The emission layer 230 may include an active layer and at least one or more cavities. For example, the emission layer 230 may include an active layer, a first cavity disposed below the active layer, and a second cavity disposed above the active layer. The light emitting layer 230 of the embodiment may include both the first cavity and the second cavity, or may include only one of the two.

The active layer may include any one of a single well structure, a multiple well structure, a single quantum well structure, a multi quantum well (MQW) structure, a quantum dot structure, or a quantum wire structure.

The active layer may include a quantum well layer and a quantum barrier layer using a group III-V or VI compound semiconductor material. The quantum well layer may be formed of a material having an energy band gap smaller than the energy band gap of the quantum barrier layer. The active layer may be formed in a 1 to 3 pair structure such as InGaAs/AlxGaAs, alGaInP/GaInP, AlGaAs/AlGaAs, AlGaAs/GaAs, GaAs/InGaAs, but is not limited thereto. The active layer may not be doped with a dopant.

The first cavity and the second cavity may be formed of $Al_yGa_{(1-y)}As$(0<y<1), but are not limited thereto. For example, the first cavity and the second cavity may each include a plurality of layers of $Al_yGa_{(1-y)}As$.

The surface emitting laser device 201 according to the embodiment may provide an oxide layer 240. The oxide layer 240 may include an insulating region 242 and an opening 241. The insulating region 242 may surround the opening 241. For example, the opening 241 may be disposed on the first area (center area) of the emission layer 230, and the insulating region 242 may be disposed on the second area (edge area) of the emission layer 230. The second area may surround the first area.

The opening 241 may be a passage area through which current flows. The insulating region 242 may be a blocking region that blocks the flow of current. The insulating region 242 may be referred to as an oxide layer or an oxide layer.

The surface emitting laser device 201 according to the embodiment may include a second reflective layer 250. The second reflective layer 250 may be disposed on the oxide layer 240.

The second reflective layer 250 may include a gallium-based compound, for example, AlGaAs, and the second reflective layer 250 may be doped with a second conductivity type dopant. The second conductivity-type dopant may be a p-type dopant such as Mg, Zn, Ca, Sr, Ba, or the like. Meanwhile, the first reflective layer 220 may be doped with a p-type dopant, and the second reflective layer 250 may be doped with an n-type dopant.

The second reflective layer 250 may also be a Distributed Bragg Reflector (DBR). For example, the second reflective layer 250 may have a structure in which a plurality of layers including materials having different refractive indices are alternately stacked at least once or more.

The second reflective layer 250 having such a structure may have a reflectance of 99.9% for light having a wavelength of about 940 nanometers.

The second reflective layer 250 may be formed by alternately stacking layers, and the number of pairs of layers in the first reflective layer 220 may be greater than the number of pairs of layers in the second reflective layer 250. As described above, the reflectance of the first reflective layer 220 is 99.999%, which may be greater than the reflectance of 99.9% of the second reflective layer 250.

In an embodiment, the second reflective layer 250 may include a plurality of layers disposed on the emission layer 230. Each layer may be formed of a single layer or a plurality of layers.

The surface emitting laser device 201 according to the embodiment may provide a passivation layer 270. The passivation layer 270 may surround a portion of the light emitting structure. Some regions of the light emitting structure may include, for example, the light emitting layer 230, the oxide layer 240, and the second reflective layer 250. The passivation layer 270 may be disposed on the upper surface of the first reflective layer 220. The passivation layer 270 may be disposed on the edge region of the second reflective layer 250. When the light emitting structure is partially mesa etched, a part of the top surface of the first reflective layer 220 may be exposed, and a partial region of the light emitting structure may be formed. The passivation layer 270 may be disposed around a portion of the light emitting structure and on the exposed top surface of the first reflective layer 220.

The passivation layer 270 may protect the light emitting structure from the outside and may block an electrical short between the first reflective layer 220 and the second reflective layer 250. The passivation layer 270 may be formed of an inorganic material such as $SiO_2$, but is not limited thereto.

The surface emitting laser device 201 according to the embodiment may provide a second electrode 282. The second electrode 282 may be electrically connected to the pad electrode 280. The second electrode 282 may contact a portion of the upper surface of the second reflective layer 250.

The second electrode 282 and the pad electrode 280 may be made of a conductive material. For example, the second electrode 282 and the pad electrode 280 are platinum (Pt), aluminum (Al), titanium (Ti), chromium (Cr), nickel (Ni), tungsten (W), copper (Cu), gold (Au) and may be formed in a single-layer or multi-layered structure.

(Flip Chip Type Surface Emitting Laser Device)

Next, FIG. 13 is another cross-sectional view of a surface emitting laser device according to an embodiment.

The surface emitting laser device according to the embodiment can be applied to the flip-chip type surface emitting laser device as shown in FIG. 13.

In addition to the vertical type, the surface emitting laser device according to the embodiment may have a flip chip type in which the first electrode 215 and the second electrode 282 face the same direction as shown in FIG. 13.

For example, in the flip-chip type surface emitting laser device shown in FIG. 13, the first electrode parts 215 and 217, the substrate 210, the first reflective layer 220, the active region 230, and the aperture region 240, the second reflective layer 250, the second electrode parts 280 and 282, the first passivation layer 271, the second passivation layer 272, and the non-reflective layer 290 may be included. In this case, the reflectivity of the second reflective layer 250 may be designed to be higher than that of the first reflective layer 220.

In this case, the first electrode parts 215 and 217 may include a first electrode 215 and a first pad electrode 217. The first electrode 215 may be electrically connected to the first reflective layer 220 exposed through a predetermined mesa process, and the first pad electrode 217 may be electrically connected to the first electrode 215.

The first electrode parts 215 and 217 may be made of a conductive material, and may be, for example, metal. For example, the first electrode 215 includes at least one of aluminum (Al), titanium (Ti), chromium (Cr), nickel (Ni), copper (Cu), and gold (Au), and has a single layer or multilayer structure. The first electrode 215 and the first pad electrode 217 may include the same metal or different metals.

When the first reflective layer 220 is an n-type reflective layer, the first electrode 215 may be an electrode for the n-type reflective layer.

The second electrode parts 280 and 282 may include a second electrode 282 and a second pad electrode 280, and the second electrode 282 is electrically connected on the second reflective layer 250, the second pad electrode 280 may be electrically connected to the second electrode 282.

When the second reflective layer 250 is a p-type reflective layer, the second electrode 282 may be a p-type electrode.

The second electrode (see FIGS. 4 and 8) according to the above-described embodiment may be applied equally to the second electrode 282 of the flip-chip type surface emitting laser device.

The first insulating layer 271 and the second insulating layer 272 may be made of an insulating material, for example, nitride or oxide. For example, it may include at least one of polyimide, silica ($SiO_2$), or silicon nitride ($Si_3N_4$).

Fourth Embodiment

FIG. 14 is a plan view of a surface emitting laser package 200 according to a fourth embodiment, and FIG. 15 is a top view of the surface emitting laser package according to the fourth embodiment shown in FIG. 14 while a transmissive part 250 and a reflective part 260 are omitted. The transmissive part 250 and the reflective part 260 may be referred to as a diffusion part, but the present disclosure is not limited thereto.

First, referring to FIG. 14, the surface emitting laser package 200 according to the fourth embodiment may include a body 210, a transmission part 250, and a reflection part 260. In the drawings of the embodiment, a ground may be defined by an x-axis and a y-axis, and a normal direction perpendicular to the ground (xy plane) may be the z-axis. In the embodiment, the horizontal width of the body 210 in the x-axis direction on the surface may be greater than the horizontal width in the y-axis direction, but is not limited thereto. An index mark M1 is formed on the body 210 so that the positions of the transmitting part 250 and the reflecting part 260 can be easily identified. The cross-sectional lines A1-A1' and A2-A2' in FIGS. 14 and 15 will be described with reference to FIGS. 16A and 16B. The body 210 may be referred to as a substrate, but is not limited thereto.

Referring to FIGS. 14 and 15, the surface emitting laser package 200 according to the fourth embodiment includes a body 210 including a cavity C, and a surface emitting laser device 230 disposed inside the cavity C, a light receiving device 240 disposed in the cavity C to be spaced apart from the surface emitting laser device 230 and detecting light emitted from the surface emitting laser device 230, and a transmissive part 250 disposed on the upper body 210 and a reflective part 260 disposed on the light receiving device 240. The transmissive part 250 and the reflective part 260 may be referred to as a diffusion part.

Referring to FIG. 15, the surface emitting laser device 230 may include a light emitting part 100 and a pad part 235.

In addition, the embodiment may include a single or a plurality of electrode parts disposed at the bottom of the cavity C between the surface emitting laser device 230 and the light receiving device 240.

For example, the embodiment may include a first electrode part 221 on which the surface emitting laser device 230 is disposed, and a third electrode part 223 electrically connected to the surface emitting laser device 230 by a first wire W1, a second electrode part 222 on which the light receiving device 240 is disposed, and a fourth electrode part 224 electrically connected to the light receiving device 240 by a second wire W2. The second electrode part 222 may extend from the first electrode part 221 to be integrally formed, but is not limited thereto.

In the embodiment, the laser emitted from the surface-emitting laser device 230 is diffused through the transmission unit 250 and the light-receiving device 240 may sense light reflected from the package, and the amount of light detected by measuring the degree of change, whether or not the transmission part 250 is attached or detached can be precisely controlled.

In this case, in the embodiment, the transmissive part 250 may be disposed in a beam divergence range of the surface-emitting laser device 230 and a reflective part 260 may be disposed in other areas. Through this, light reflected and totally reflected inside the package may be reflected inside without sending it to the outside through the reflector 260. In addition, on the contrary, light incident from the outside of the package to the inside of the package may be reflected through the reflecting unit 260 so as not to be incident inside. Through this, the embodiment has a technical effect of providing a surface-emitting laser package and an optical assembly having excellent reliability and stability by remarkably improving the photo-sensing performance of the light-receiving device 240.

Next, the surface emitting laser package 200 according to the fourth embodiment will be described in more detail with reference to FIGS. 16A and 16B.

FIG. 16A is a cross-sectional view of the surface emitting laser package 200 according to the fourth embodiment shown in FIGS. 14 and 15 along line A1-A1', and FIG. 16B is a cross-sectional view taken along line A2-A2' of the surface emitting laser package 200 according to a fourth embodiment shown in FIGS. 14 and 15.

Referring to FIGS. 16A and 16B, a surface emitting laser package 200 according to a fourth embodiment includes a body 210 including a cavity C, and a surface emitting laser device 230 disposed inside the cavity C, a light receiving device 240 disposed in the cavity C to be spaced apart from the surface emitting laser device 230 and detecting light emitted from the surface emitting laser device 230, and a transmissive part 250 disposed on the body 210 on the surface emitting laser device 230 and a reflective part 260 disposed on the light receiving device 240.

In the embodiment, the body 210 may be formed of a single layer or a plurality of layers. For example, the body 210 may be formed as a single-layered substrate, or may include a first substrate 211, a second substrate 212 and a third substrate 213 as shown.

The body 210 may include a material having high thermal conductivity. Accordingly, the body 210 may be provided with a material having good heat dissipation characteristics so that heat generated by the surface emitting laser device 230 can be efficiently discharged to the outside. For example, the body 210 may include a ceramic material. The body 210 may include a low temperature co-fired ceramic (LTCC) or a high temperature co-fired ceramic (HTCC).

In addition, the body 210 may include a metal compound. The body 210 may include a metal oxide having a thermal conductivity of 140 W/mK or more. For example, the body 210 may include aluminum nitride (AlN) or alumina ($Al_2O_3$).

In addition, the body 210 may include a resin-based insulating material. The body 210 may be provided with a silicone resin, an epoxy resin, a thermosetting resin including a plastic material, or a high heat resistance material.

In addition, the body 210 may include a conductive material. For example, when the body 210 is made of a conductive material, such as metal, an insulating layer (not shown) for electrical insulation between the body 210 and the surface emitting laser device 230 may be provided therebetween.

Accordingly, according to the embodiment, there is a technical effect of providing a surface emitting laser package and an optical module having excellent heat dissipation characteristics while being capable of driving high output and high voltage.

The first substrate 211, the second substrate 212, and the third substrate 213 may have the same material of the body 210 or may include at least one differently.

Next, in an embodiment, a single or a plurality of electrode parts may be disposed on the body 210. For example, referring to FIG. 15, in the embodiment, a first electrode part 221, a second electrode part 222, a third electrode part 223, and a fourth electrode part 224 can be placed on the body 210.

For example, in an embodiment, a first electrode part 221 on which the surface emitting laser device 230 is disposed, and a third electrode part 223 electrically connected to the surface emitting laser device 230 by a first wire W1, a second electrode part 222 on which the light receiving device 240 is disposed, and a fourth electrode part 224 electrically connected to the light receiving device 240 by a second wire W2 (see FIG. 15).

The first to fourth electrode parts 221 to 224 may be formed of a conductive metal material. For example, the first to fourth electrode parts 221 to 224 may be at least one of Cu, ag, Ni, Cr, Ti, al, Rh, Pd, Ir, Ru, Mg, Zn, Pt, au, Hf or an alloy of two or more of them and may be a single layer or a multilayer.

Referring back to FIGS. 16A and 16B together, the first electrode part 221 may include a first upper electrode 221a disposed on the body 210 and a first lower electrode 221b disposed under the body 210. A surface emitting laser device 230 may be disposed on the first upper electrode 221a. The first lower electrode 221b may be formed larger than the first upper electrode 221a to improve electrical conductivity and heat dissipation efficiency.

In addition, the second electrode part 222 may include a second upper electrode 222a disposed on the body 210 and a second lower electrode 222b disposed under the body 210. The light receiving device 240 may be disposed on the second upper electrode 222a. The second lower electrode 222b may be formed larger than the second upper electrode 222a to improve conductivity and heat dissipation efficiency.

In addition, the third electrode part 223 may include a third upper electrode 223a disposed on the body 210 and a third lower electrode 223b disposed under the body 210. The third upper electrode 223a may be electrically connected to the surface emitting laser device 230 by a first wire W1.

At this time, according to the embodiment, the third electrode part 223 is disposed between the first electrode part 221 and the second electrode part 222, and the surface emitting laser device 230 is disposed thereon, and the light receiving device 240 is disposed on the second electrode part 222 to be spaced apart from the surface emitting laser device 230. Since the beam divergence of the surface emitting laser device 230 can be secured to be a wide range and can minimize the area occupied by the light receiving device inside the package, it is possible to perform a high-sensitivity light sensing function and provide a compact surface emitting laser package and optical module.

Next, features of the electrode part in the embodiment will be described in more detail with reference to FIGS. 17 to 18B.

FIG. 17 is a plan view of the surface emitting laser package according to the fourth embodiment shown in FIG. 16 while the surface emitting laser device 230 and the light receiving device 240 are omitted. FIG. 18A is a cross-sectional view along line A3-A3' of the surface emitting laser package according to a fourth embodiment shown in FIG. 17, and FIG. 18B is a cross-sectional view along line A4-A4' of the surface emitting laser package according to the fourth embodiment shown in FIG. 17.

Referring to FIGS. 18A and 18B, the first electrode part 221 includes a first upper electrode 221*a* disposed on the body 210, and a first lower electrode 221*b* disposed under the body 210, and a first connection electrode 221*c* electrically connecting the first upper electrode 221*a* and the first lower electrode 221*b*. The first connection electrode 221*c* may be a via electrode, but is not limited thereto.

The first upper electrode 221*a* may be electrically connected to the surface emitting laser device 230. For example, the surface emitting laser device 230 may be disposed on the first upper electrode 221*a*.

Next, referring to FIG. 18A, the second electrode part 222 includes a second upper electrode 222*a* disposed on the body 210 and a second lower electrode 222*b* disposed under the body 210. Referring to FIG. 17, the second electrode part 222 may be integrally formed extending from the first electrode part 221, but is not limited thereto.

When the second electrode part 222 is integrally formed extending from the first electrode part 221, the second upper electrode 222*a* and the second lower electrode 222*b* of the second electrode part 222 are electrically connected by the first connection electrode 221*c* of the first electrode part 221.

In this case, the second upper electrode 222*a* may be electrically connected to the light receiving device 240. For example, a light receiving device 240 may be disposed on the second upper electrode 222*a*.

Next, the third electrode part 223 includes a third upper electrode 223*a* disposed on the body 210, a third lower electrode 223*b* disposed under the body 210 and a third connection electrode 223*c* electrically connecting the third upper electrode 223*a* and the third lower electrode 223*b*. The third upper electrode 223*a* may be electrically connected to the surface emitting laser device 230 through a first wire W1. The third connection electrode 223*c* may be a via electrode.

Referring to FIGS. 15 and 17, a surface-emitting laser device 230 is disposed on a first electrode part 221, and a light-receiving device 240 is spaced apart from the surface-emitting laser device 230 and is disposed on the second electrode part 222. Through this, a wide beam divergence range of the surface-emitting laser device 230 can be secured, and an area occupied by the light-receiving device in the package can be minimized. Accordingly, the embodiment can provide a compact surface-emitting laser package and an optical assembly capable of performing a high-sensitivity light sensing function.

Next, referring to FIGS. 15 and 17, the fourth electrode part 224 includes a fourth upper electrode 224*a* disposed on the body 210 and a fourth lower electrode (not shown) disposed under the body 210 and a fourth connection electrode 224*c* electrically connecting the fourth upper electrode 224*a* and the fourth lower electrode. The fourth upper electrode 224*a* may be electrically connected to the light receiving device 240 through a second wire W2 (see FIG. 15). The fourth connection electrode 224*c* may be a via electrode.

Meanwhile, referring to FIGS. 18A and 18B, a cavity C may be disposed in the body 210 of the embodiment, and a single cavity or a plurality of cavities may be disposed. For example, the body 210 of the embodiment may include a first cavity C1 located on the second substrate 212 and a second cavity C2 located on the third substrate 213. The horizontal width of the second cavity C2 may be larger than the horizontal width of the first cavity C1.

Referring to FIG. 16A, a surface emitting laser device 230 and a light receiving device 240 may be disposed in the first cavity C1, and a transmitting part 250 and a reflecting part 260 may be disposed in the second cavity C2.

Next, with reference to FIGS. 19 to 21, a description will be given of the surface emitting laser device 230 in the surface emitting laser package according to the embodiment.

FIG. 19 is a plan view of a surface emitting laser device 230 in a surface emitting laser package according to an embodiment, and FIG. 20 is a partial enlarged view of area B of a surface emitting laser device 230 in the surface emitting laser package according to the embodiment shown in FIG. 18.

Referring to FIGS. 19 to 21, the surface emitting laser device 230 according to the embodiment is illustrated for a vertical-cavity surface emitting laser (VCSEL), but is not limited thereto.

Referring to FIG. 19, a surface emitting laser device 230 in a surface emitting laser package according to an embodiment may include a light emitting part 100 and a pad part 235. Referring to FIGS. 19 and 20, a plurality of light emitting emitters E1, E2, and E3 may be disposed in the light emitting part 100.

FIG. 21 is a cross-sectional view taken along line A5-A5' of the first emitter E1 of the surface emitting laser device 230 of the surface emitting laser package according to the embodiment shown in FIG. 20.

Referring to FIG. 21, in the embodiment, the first emitter E1 of the surface emitting laser device includes a first electrode 115, a support substrate 110, a first reflective layer 120, a cavity region 130, and an aperture. 141, the insulating region 142, the second reflective layer 150, the second contact electrode 155, the second electrode 180, and the passivation layer 170.

In an embodiment, the support substrate 110 may have excellent heat dissipation characteristics, and may be a conductive substrate or a non-conductive substrate. For example, the support substrate 110 may be provided with at least one selected from among conductive materials such as copper (Cu), gold (Au), nickel (Ni), molybdenum (Mo), copper-tungsten (Cu—W), a carrier wafer (eg, Si, Ge, alN), GaAs, ZnO, SiC, etc, but is not limited thereto.

In an embodiment, the first electrode 115 may be disposed under the support substrate 110, and the first electrode 115 may be disposed in a single layer or in multiple layers of a conductive material.

The first reflective layer 120 may be provided with at least one of a group III-V or group II-VI compound semiconductor doped with a first conductivity type dopant. The second reflective layer 150 may be provided with at least one of a Group III-V or group II-VI compound semiconductor doped with a second conductivity type dopant.

For example, the first semiconductive layer 120 and the second reflective layer 150 may be one of a group including GaAs, GaAl, InP, InAs, and GaP. The first semiconductor layer 120 and the second reflective layer 150 can be provided as semiconductors having a composition formula of $Al_xGa_{1-x}As(0<x<1)/Al_yGa_{1-y}As(0<y<1)(y<x)$.

The cavity region 130 is disposed between the first reflective layer 120 and the second reflective layer 150, a predetermined active layer (not shown) and a first cavity (not shown) disposed below the active layer, a second cavity (not shown) disposed above the active layer may be included. The cavity region 130 of the embodiment may include both the first cavity and the second cavity, or may include only one of the two.

In an embodiment, an insulating region 142 is disposed on the cavity region 130, and an aperture 141 defined by the insulating region 142 may be positioned.

The insulating region 142 may be formed of an insulating layer, for example, aluminum oxide, and thus may function as a current insulating region, and an aperture 141 may be disposed in the central region. For example, in a predetermined AlGaAs layer, the insulating region 142 may be formed as the edge changes to $Al_2O_3$ by reacting with $H_2O$, and the central region not reacting with $H_2O$ may become the aperture 141 made of AlGaAs.

The surface emitting laser device according to the embodiment may be mesa etched from the second reflective layer 150 in the region around the aperture 141 to the insulating region 142 and the cavity region 130. In addition, a portion of the first reflective layer 120 may be mesa etched.

A second contact electrode 155 may be disposed on the second reflective layer 150. The area of the second reflective layer 150 exposed by the second contact electrode 155 may correspond to the aperture 141, which is a central area of the insulating region 142. The contact electrode 155 may improve contact characteristics between the second reflective layer 150 and the second electrode 180.

The passivation layer 170 may be disposed on a side surface and an upper surface of the mesa-etched light emitting structure and an upper surface of the first reflective layer 120. The passivation layer 170 may be made of an insulating material, for example, a nitride or an oxide.

The second electrode 180 electrically contacts the exposed second contact electrode 155 and extends above the passivation layer 170 to receive current from the pad part 235. The second electrode 180 may be made of a conductive material. For example, the second electrode 180 includes at least one of aluminum (Al), titanium (Ti), chromium (Cr), nickel (Ni), copper (Cu), and gold (Au) and it can be formed in a single-layer or multi-layer structure.

Referring back to FIG. 16A, the light receiving device 240 employed in the surface emitting laser package according to the embodiment may be a photodetector for a monitor, and may receive incident light by applying a reverse bias voltage. The second upper electrode 222a electrically connected to the light receiving device 240 may include a plurality of separated electrodes, which apply external power to the light receiving device 240 or an electrical signal detected by the light receiving device 240 can be transmitted to the outside.

Next, technical features of the light emitting device package according to the embodiment will be described in more detail with reference to FIG. 22A. FIG. 22A is a detailed cross-sectional view of the surface emitting laser package 200 according to the fourth embodiment shown in FIG. 16A while a first wire W1 is omitted.

The surface-emitting laser package 200 according to the fourth embodiment may include a transmitting part 250 disposed on the surface-emitting laser device 230 and a reflecting part 260 disposed on the light-receiving device 240 while the transmitting part 250 and the reflecting part 260 may be disposed on the body 210.

According to the embodiment, the laser emitted from the surface emitting laser device 230 is diffused through the transmission unit 250 and the light receiving device 240 senses the light reflected from the package inside. It is possible to precisely control whether the transmission part 250 is attached or detached by measuring the changes of the amount of the detected light.

The transmissive part 250 is disposed in a range of beam divergence from the surface emitting laser device 230, and the reflective part 260 is disposed on the light receiving device 240 to reflect and totally reflect light inside the package. The light-sensing performance of the light receiving device 240 can be significantly improved by being reflected inside the light receiving device 240 through the reflection part 260, and on the contrary, light incident from the outside of the package to the inside of the package is reflected in the reflection part 260. So, the light-sensing performance in the light receiving device 240 can be remarkably improved because light incident from the outside of the package to the inside of the package is not incident inside.

There is a possibility that the transmitting part 250 and the reflecting part 260 may be separated from the body 210 in an extreme environment such as vibration or long-term use of the surface-emitting laser package. When the transmitting part 250 or the reflecting part 260 is separated, the strong laser emitted from the surface-emitting laser device 230 is directly irradiated to the outside without passing through the transmitting part 250 to damage the eyesight of the user, etc.

Accordingly, according to the embodiment, the transmitting part 250 and the reflecting part 260 may be disposed in the second cavity C2 (see FIG. 18A), and the adhesive layer 270 may be disposed on the exposed second substrate 212. As a result, the bonding force between the transmitting part 250 or the reflecting part 260 and the second substrate 212 may be improved.

The adhesive layer 270 may include an organic material. For example, the adhesive layer 270 may include an epoxy-based resin or a silicone-based resin. In the embodiment, by improving the bonding force between the transmitting part 250, the reflecting part 260 and the second substrate 212, the surface-emitting laser device 230 and a laser package can provide a stable surface light emission that may not injure a person by strong light.

In an embodiment, the transmission unit 250 may function to expand a divergence angle of light emitted from the surface emitting laser device 230. To this end, the transmission part 250 may include a micro lens, an uneven pattern, or the like.

In addition, the transmissive part 250 may include an anti-reflective function. For example, the transmissive part 250 may include an anti-reflective layer (not shown) disposed on one surface facing the surface emitting laser device 230. For example, the transmissive part 250 may include an anti-reflective layer disposed on a lower surface facing the surface emitting laser device 230. Through this, the non-reflective layer may prevent light incident from the surface emitting laser device 230 from being reflected from the surface of the transmitting part 250 and transmit it, thereby improving light loss due to reflection.

The anti-reflective layer may be formed of, for example, an anti-reflective coating film, and may be attached to the surface of the transmission part 250. In addition, the anti-reflective layer may be formed on the surface of the transmission part 250 through spin coating or spray coating. For example, the anti-reflective layer may be formed as a single layer or multiple layers including at least one of a group including $TiO_2$, $SiO_2$, $Al_2O_3$, $Ta_2O_3$, $ZrO_2$, and $MgF_2$.

Referring to FIG. 14 for a moment, the first width of the body 210 in the x-axis direction may be larger than the second width in the y-axis direction, through which the transmitting part 250 and the reflecting part 260 are formed in the x-axis direction. By arrangement, it is possible to improve light diffusivity and ensure reliability. For example, the first width of the body 210 in the x-axis direction may be about 3.0 mm to 5.0 mm, and the second width in the y-axis direction may be about 2.0 mm to 3.0 mm, but is not limited thereto.

Referring back to FIG. 22A, the thickness T20 in the z-axis direction of the body 210 is secured to be about 1.0 mm to 2.0 mm, so that a highly reliable and compact light emitting device package can be implemented.

In this case, the third horizontal width W30 in the y-axis direction of the surface emitting laser device 230 may be about 500 μm to 1,500 μm. The horizontal width of the surface emitting laser device 230 in the x-axis direction may also be the same as the third horizontal width W30 in the y-axis direction, but is not limited thereto.

In the embodiment, since the light output is determined according to the number of emitters of the surface emitting laser device chip, the size of the surface emitting laser device may be different depending on the product. For example, at the mobile level recently, since a performance of about 1 W to 2 W is required for radiant power, the size of the surface emitting laser device may be about 500×500 μm to 1,500×1500 μm.

For example, in the embodiment, the third horizontal width W30 of the surface emitting laser device 230 may be 500 μm to 1,500 μm, but is not limited thereto.

Next, the first separation distance D1 from the top surface of the surface emitting laser device 230 to the transmission part 250 may range from $2/75$ to about $1/5$ of the third horizontal width W30 of the surface emitting laser device 230. For example, in an embodiment, the first separation distance D1 from the top surface of the surface emitting laser device 230 to the transmission part 250 may be about 40 μm to 100 μm.

For example, the first separation distance D1 from the top surface of the surface emitting laser device 230 to the transmission part 250 is about $2/75$ or more of the third horizontal width W30 of the surface emitting laser device 230. For example, a minimum distance as first separation distance D1 of about 40 μm or more may be secured in consideration of the first wire W1 process. In addition, the first separation distance D1 from the top surface of the surface emitting laser device 230 to the transmission part 250 is about $1/5$ or less of the third horizontal width W30 of the surface emitting laser device 230. For example, the first separation distance may be about 100 μm or less such that a compact light emitting device package can be provided.

In addition, in the embodiment, the thickness T1 of the transmitting part 250 can be about 200 μm to 1,000 μm in consideration of the beam divergence angle Θ and the divergence angle Θ in the surface emitting laser device 230.

The thickness T1 of the transmission part 250 is controlled to be about 200 μm or more, so that a sufficient range of laser emission can be secured. When the thickness T1 of the transmission part 250 is less than 200 μm, there is a concern in that it is damaged during the manufacturing process or actual use. In addition, by designing the thickness T1 of the transmission part 250 to be 1,000 μm or less, a compact surface emitting laser package may be implemented.

In the embodiment, the beam divergence angle θ in the surface emitting laser device 230 may be designed to be 0° or more. For example, if two apertures through which light is emitted from the surface emitting laser device 230 are formed, the beam divergence angle Q may be made close to 0°.

In addition, in the embodiment, the divergence angle θ range of the transmission part 250 may be greater than 0° to within 160° in consideration of the product.

In an embodiment, the measurement of the divergence angle may be performed by measuring a radiance or measuring an irradiance, but is not limited thereto.

Next, the embodiment may include a reflector 260 disposed on the light receiving device 240. Through this, in the embodiment, the transmitting part 250 is disposed in the range of the beam divergence of the surface emitting laser device 230, and the reflecting part 260 is disposed in the other areas, so that reflection and total reflection are performed inside the package. Light may be reflected inside without being sent to the outside through the reflector 260, and on the contrary, light incident from the outside of the package to the inside of the package may be reflected through the reflector 260 so as not to be incident inside.

Accordingly, the embodiment has a technical effect of providing a surface emitting laser package and an optical assembly having excellent reliability and stability by remarkably improving the light-sensing performance in the light receiving device 240.

Unlike the transmissive part 250, the reflective part 260 may block light from inside/outside the package to be reflected inside/outside, and may be formed of a resin layer including A1, Ag powder or alloy powder thereof.

In the embodiment, the range of the first width W10 of the transmission part 250 may be set to match the aperture of the surface emission laser device 230 and the divergence angle of the beam. Through this, the incidence rate to the transmitting part 250 of the outgoing light can be controlled to a level of almost 100%, and the incidence rate of the outgoing light to the reflecting part 260 can be controlled to a level of almost 0%.

Next, FIG. 22B is a cross-sectional view of another embodiment of the surface emitting laser package according to the fourth embodiment shown in FIG. 22A.

In an embodiment, the thickness T3 of the second reflective part 262 may be formed to be thinner than the thickness T1 of the transmitting part 250. Through this, while securing the widest divergence angle that can be emitted from the transmitting part 250, the light reflected from the second reflecting part 262 inside the package is reflected to the light receiving device 240 as much as possible, thereby improving the reliability of the light sensing performance. There is a technical effect that can provide an excellent surface emitting laser package and optical assembly.

In an embodiment, the thickness T3 of the second reflective part 262 may range from $1/10$ to $1/2$ of the thickness T1 of the transmissive part 250. Since the thickness T3 of the second reflecting part 262 is secured to be equal to or greater than $1/10$ of the thickness T1 of the transmitting part 250, it can function as a reflecting part.

In particular, the thickness T3 of the second reflective part 262 may be less than $1/2$ of the thickness T1 of the transmissive part 250. Through this, the light output may be improved by increasing a ratio of light that may be transmitted upward of the second reflecting part 262.

For example, the thickness T3 of the second reflector 262 may be set to about 20 μm to about 500 μm. Since the thickness T3 of the second reflective part 262 is secured to be $1/10$ or more of the thickness T1 of the transmission part 250, for example, about 20 μm or more, it may function as a reflective part.

In addition, the thickness T3 of the second reflective part 262 may be less than ½ of the thickness T1 of the transmissive part 250, for example, 500 µm or less. Through this, the light output may be improved by increasing a ratio of light that may be transmitted upward of the second reflecting part 262.

Referring back to FIG. 22A, the first horizontal width W10 of the transmission part 250 may be larger than the second horizontal width W20 of the reflective part 260. Accordingly, the embodiment may increase the amount of light reflected by the light receiving device 240 and received.

The reflective part 260 may vertically overlap the light-receiving device 240, but may not vertically overlap the third electrode part 223 or the surface emitting laser device 230.

For example, the first horizontal width W10 of the transmissive part 250 may be larger than the second horizontal width W20 of the reflective part 260. Accordingly, it is possible to provide a surface-emitting laser package and an optical assembly having excellent reliability of photo-sensing performance by increasing the likelihood that light totally reflected from the upper surface of the transmitting part 250 will also reach the light-receiving device 240.

In an embodiment, the first horizontal width W10 of the transmission part 250 may be in the range of 18/15 to 6 times the third horizontal width W30 of the surface emitting laser device 230. For example, the first horizontal width W10 of the transmission part 250 may be about 1,800 µm to 3,000 µm. In this case, the third horizontal width W30 of the surface emitting laser device 230 may be 500 µm to 1,500 µm, but is not limited thereto.

In the embodiment, the first horizontal width W10 of the transmission part 250 is formed to be 18/15 times or more of the third horizontal width W30 of the surface emitting laser device 230, for example, about 1,800 µm or more such that first horizontal width W10 may be secured to be wider than the divergence angle of the surface emitting laser device 230.

In addition, in an embodiment, the first horizontal width W10 of the transmission part 250 may be formed to be 6 times or less, for example, about 3,000 µm or less of the third horizontal width W30 of the surface emitting laser device 230. Accordingly, in the embodiment, by securing the area of the reflective unit 260, the light-receiving device 240 may sense the light reflected from the inside of the package by the laser emitted from the surface emitting laser device 230. Through this, the embodiment can more precisely control whether the transmission unit 250 is detached or not by measuring the degree of change in the amount of light detected.

In addition, in an embodiment, the second horizontal width W20 of the reflector 260 may range from 16/15 to 4 times the horizontal width of the light receiving device 240. For example, the second horizontal width W20 of the reflecting part 260 may be about 1,600 µm to 2,000 µm, and the horizontal width of the light receiving device 240 may be about 500 µm to 1,500 µm, but is not limited thereto.

Accordingly, the horizontal width of the diffusion part including the transmission portion 250 and the reflection portion 260 may be about 3,400 µm to 5,000 µm, but is not limited thereto.

For example, in an embodiment, the second horizontal width W20 of the reflector 260 may be formed to be 16/15 times or more of the horizontal width of the light receiving element 240, for example, about 1,600 µm or more. Accordingly, an area of the reflective unit 260 may be secured so that the light receiving element 240 may detect light reflected from the inside of the package by the laser. Through this, the embodiment can more precisely control whether the transmission unit 250 is detached or not by measuring the degree of change in the amount of light detected.

In addition, in the embodiment, the second horizontal width W20 of the reflective part 260 is formed to be less than 4 times the horizontal width of the light receiving device 240, for example, about 2,000 µm or less, so that it may be prevented for the reflective part 260 from overlapping with a divergence angle of the surface emitting laser device 230.

Referring back to FIG. 22B, the thickness T3 of the second reflecting part 262 may be set in a range of about 1/75 to about 1 times of the third horizontal width W30 of the surface emitting laser device 230. As the thickness T3 of the second reflecting part 262 is formed to be about 1/75 or more of the third horizontal width W30 of the surface emitting laser device 230, it can function as a reflector and the proportion of transmitted lasers can be improved.

In addition, the thickness T3 of the second reflecting part 262 may be formed to be less than about 1 times the third horizontal width W30 of the surface emitting laser device 230. Accordingly, the second reflecting part 262 may function as a reflecting part, and the thickness of the second reflecting unit 262 may be controlled to be thin to improve light output.

For example, the thickness T3 of the second reflector 262 may be set to about 20 µm to about 500 µm. For example, the thickness T3 of the second reflecting part 262 is formed to be about 1/75 or more of the third horizontal width W30 of the surface emitting laser device 230, for example, about 20 µm or more. As a result, the ratio of the laser that can be transmitted can be improved while functioning as a reflector.

In addition, the thickness T3 of the second reflective part 262 may be about 1 times or less, for example, about 500 µm of the third horizontal width W30 of the surface emitting laser device 230. Accordingly, the second reflecting part 262 may function as a reflecting part, and the thickness of the second reflecting part 262 may be controlled to be thin to improve light output.

Fifth Embodiment

FIG. 23A is a plan view of a surface emitting laser package 202 according to a fifth embodiment, and FIG. 23B is a plan view of the surface emitting laser package 202 according to the fifth embodiment shown in FIG. 23A while the second transmission part 252 and the third reflection part 263 are omitted.

The fifth embodiment can adopt the technical features of the fourth embodiment, and the main features of the fifth embodiment will be described below.

Referring to FIGS. 23A and 23B, a surface emitting laser package 202 according to the fifth embodiment includes a body 210 including a cavity C, and a fifth electrode part 225, a sixth electrode part 226 disposed to be spaced apart from each other in the cavity C, a surface emitting laser device 230 disposed on the fifth electrode part 225 and electrically connected to the sixth electrode part 226 by a third wire W3, a second light receiving device 232 disposed on the sixth electrode part 226 to detect the light emitted from the surface emitting laser device 230 and spaced apart from the surface emitting laser device 230 in the cavity C, a second transmission part 252 disposed on the body 210 and above the surface emitting laser device 230, and a third reflection part 263 disposed on the second light receiving device 232. The second transmission part 252 and the third reflection part 263 may be referred to as a diffusion part.

The second light receiving device 232 may be electrically connected to the fifth electrode part 225 by a fourth wire W4 to apply a reverse bias voltage.

According to the fifth embodiment, the second light receiving device 232 is disposed on the sixth electrode part 226 electrically connected to the surface emitting laser device 230 to provide a light sensing function in the second light receiving device 232. And the third reflective part 263 is disposed on the second light receiving device 232, thereby realizing high-performance photo-sensing performance, and providing a compact surface emitting laser package and an optical module.

Also, referring to FIG. 23A, in the fifth embodiment, the first horizontal width W10 of the second transmission part 252 in the first axial direction is formed larger than the second horizontal width W20 of the third reflection part 263 in the first axial direction to increase the amount of light received by the second light receiving device 232.

For example, the first horizontal width W10 of the second transmission part 252 is formed larger than the second horizontal width W20 of the third reflection part 263, so that it is possible to provide a surface emitting laser package and an optical assembly having excellent reliability of light sensing performance by increasing the likelihood that light totally reflected from the upper side of the second transmission part 252 will also reach the second light receiving device 232.

In addition, as shown in FIG. 22B, in the fifth embodiment, the thickness of the third reflective portion 263 may be thinner than that of the second transmission portion 252.

Accordingly, while securing the widest divergence angle that can be emitted from the second transmission unit 252, the light reflected from the third reflection unit 263 inside the package may be reflected to the second light-receiving element 232 as much as possible. Accordingly, the embodiment has a technical effect of providing a surface-emitting laser package and an optical assembly having excellent reliability in light sensing performance.

According to the embodiment, there is a technical effect capable of providing a surface emitting laser package and an optical module having excellent reliability and stability.

In addition, according to the embodiment, it is possible to provide a compact surface emitting laser package and an optical module while being capable of driving high output and high voltage.

Sixth Embodiment

FIG. 24 is a cross-sectional view illustrating a surface emitting laser package according to a sixth embodiment.

Referring to FIG. 24, the surface emitting laser package 106 according to the sixth embodiment may provide a substrate 110.

The substrate 110 may support all components disposed on the substrate 110. For example, the substrate 110 may support a surface emitting laser device 206, a housing 130, a diffusion part 140, and a wavelength limiting member 150 disposed thereon. The surface emitting laser device 206, the housing 130, the diffusion part 140, the wavelength limiting member 150, and the substrate 110 may be modularized modules. One or a plurality of such modules may be mounted on the circuit board 160.

The substrate 110 may include a material having high thermal conductivity. The substrate 110 may be made of a material having good heat dissipation properties so that heat generated by the surface emitting laser device 206 can be efficiently discharged to the outside. The substrate 110 may include an insulating material.

For example, the substrate 110 may include a ceramic material. The substrate 110 may include a low temperature co-fired ceramic (LTCC) or a high temperature co-fired ceramic (HTCC).

In addition, the substrate 110 may include a metal compound. The substrate 110 may include a metal oxide having a thermal conductivity of 140 W/mK or more. For example, the substrate 110 may include aluminum nitride (AlN) or alumina ($Al_2O_3$).

As another example, the substrate 110 may include a resin-based insulating material. The substrate 110 may be provided with a silicone resin, an epoxy resin, a thermosetting resin including a plastic material, or a high heat resistance material.

The substrate 110 may also include a conductive material. When the substrate 110 is made of a conductive material, for example, a metal, an insulating layer for electrical insulation between the substrate 110 and the surface emitting laser device 206 may be provided.

The surface emitting laser package 106 according to the sixth embodiment may provide a surface emitting laser device 206.

The surface emitting laser device 206 may be disposed on the substrate 110. The surface emitting laser device 206 may generate a laser beam and emit a laser beam in a direction perpendicular to the upper surface of the surface emitting laser device 206. The surface emitting laser device 206 may emit a laser beam having an angle of view of 15° to 25° in an upward direction, for example. The surface emitting laser device 206 may include a plurality of emitters (E1, E2, E3, E4 in FIG. 25) emitting a circular beam. An example of the surface emitting laser device 206 will be described again later.

The surface emitting laser package 106 according to the sixth embodiment may provide a first electrode 181 and a second electrode 182.

The first electrode 181 and the second electrode 182 may be disposed on the substrate 110. The first electrode 181 and the second electrode 182 may be disposed on the substrate 110 to be spaced apart from each other.

One of the first electrode 181 and the second electrode 182 may be disposed around the surface emitting laser device 206.

The surface emitting laser device 206 may be disposed on the first electrode 181. In this case, the second electrode 182 may be disposed around the surface emitting laser device 206.

The surface emitting laser device 206 may be provided on the first electrode 181, for example, by a die bonding method. The surface emitting laser device 206 may be electrically connected to the second electrode 182. For example, the surface emitting laser device 206 and the second electrode 182 may be electrically connected by a wire 191. The surface emitting laser device 206 may be electrically connected to the second electrode 182 by a plurality of wires. The surface emitting laser device 206 may be electrically connected to the second electrode 182 by a wire 191.

The number of wires connecting the surface emitting laser device 206 and the second electrode 182 and the connection location are selected by the size of the surface emitting laser device 206 or the degree of current diffusion required by the surface emitting laser device 206.

The surface emitting laser package 106 according to the sixth embodiment may provide a first bonding part 183 and a second bonding part 184.

The first bonding part 183 and the second bonding part 184 may be disposed under the substrate 110. For example, first and second recesses spaced apart from each other are formed on the lower surface of the substrate 110, a first bonding part 183 is disposed in the first recess, and a second bonding part 185 is disposed in the second recess.

For example, a lower surface of the first bonding part 183 and a lower surface of the second bonding part 184 may be electrically connected to each other by making contact with a signal line (not shown) of the circuit board 160. The substrate 110 may be referred to as a first substrate, and the circuit board 160 may be referred to as a second substrate.

The first bonding part 183 and the second bonding part 184 may be disposed under the substrate 110 to be spaced apart from each other. The first bonding part 183 and the second bonding part 184 may have circular pads, but are not limited thereto.

The first bonding part 183 may be disposed on the lower surface of the substrate 110. The first bonding part 183 may be electrically connected to the first electrode 181. The first bonding part 183 may be electrically connected to the first electrode 181 through the first connection wiring 185. For example, the first connection wiring 185 may be disposed in a first via hole provided in the substrate 110. The first bonding part 183 and the first connection wiring 185 may be integrally formed using the same metal material.

The second bonding part 184 may be disposed on the lower surface of the substrate 110. The second bonding part 184 may be electrically connected to the second electrode 182. The second bonding part 184 may be electrically connected to the second electrode 182 through a second connection line 186. For example, the second connection wiring 186 may be disposed in a second via hole provided in the substrate 110. The second bonding part 184 and the second connection wiring 186 may be integrally formed using the same metal material.

For example, the first connection wiring 185 and the second connection wiring 186 may include tungsten (W), but are not limited thereto. Tungsten W is melted at a high temperature of 1000° C. or higher, injected into the first and second via holes, and then cured, thereby forming a first connection wiring 185 and a second connection wiring 186. A part of tungsten W may be cured under the substrate 110 to form the first and second bonding parts 183 and 184, but the embodiment is not limited thereto.

According to the sixth embodiment, driving power may be provided to the surface emitting laser device 206 through the circuit board 160.

In the surface emitting laser package 106 according to the sixth embodiment described above, it was described based on the case of connection as the surface emitting laser device 206 is connected to the first electrode 181 in a die bonding method and the second electrode 182 is connected in a wire bonding method.

However, the manner in which driving power is supplied to the surface emitting laser device 206 may be variously modified and applied. For example, the surface emitting laser device 206 may be electrically connected to the first electrode 181 and the second electrode 182 by a flip chip bonding method. In addition, the surface emitting laser device 206 may be electrically connected to both the first electrode 181 and the second electrode 182 by wire bonding.

The surface emitting laser package 106 according to the sixth embodiment may provide a housing 130. The housing 130 may be disposed on the substrate 110. The housing 130 may be disposed along the peripheral area of the substrate 106. For example, the substrate 110 may include a first region (a central region) and a second region (a peripheral region) surrounding the first region.

In this case, the surface emitting laser device 206 may be disposed on a part of the first area of the substrate 110, and the housing 130 may be disposed on the second area of the substrate 120. A second electrode 182 may be positioned between the first electrode 181 and the housing 130 on the substrate 110. The housing 130 may be disposed around the surface emitting laser device 206. The outer surface of the housing 130 may be aligned with the outer surface of the substrate 110 on a vertical line.

The height of the housing 130 may be greater than the height of the surface emitting laser device 206. The housing 130 may include a material having high thermal conductivity. The housing 130 may be made of a material having good heat dissipation properties so that heat generated by the surface emitting laser device 206 can be efficiently discharged to the outside. The housing 130 may include an insulating material.

For example, the housing 130 may include a ceramic material. The housing 130 may include a low temperature co-fired ceramic (LTCC) or a high temperature co-fired ceramic (HTCC).

For example, the housing 130 may include a metal compound. The housing 130 may include a metal oxide having a thermal conductivity of 140 W/mK or more. For example, the housing 130 may include aluminum nitride (AlN) or alumina ($Al_2O_3$).

For example, the housing 130 may include a resin-based insulating material. Specifically, the housing 130 may be made of a silicone resin, an epoxy resin, a thermosetting resin including a plastic material, or a high heat resistance material.

The housing 130 may be made of a conductive material, such as a metal.

For example, the housing 130 may include the same material as the substrate 110. When the housing 130 is formed of the same material as the substrate 110, the housing 130 may be integrally formed with the substrate 110.

In addition, the housing 130 may be formed of a material different from that of the substrate 110. The substrate 110 may also be referred to as a housing. In this case, the substrate 110 may be referred to as a first housing and the housing 130 may be referred to as a second housing. Alternatively, the housing 130 may be referred to as a substrate. In this case, the substrate 110 may be referred to as a first substrate, and the housing 130 may be referred to as a second substrate.

According to the sixth embodiment, the substrate 110 and the housing 130 may be formed of a material having excellent heat dissipation properties. Accordingly, heat generated from the surface emitting laser device 206 can be effectively discharged to the outside.

According to the sixth embodiment, when the substrate 110 and the housing 130 are provided as separate components and are combined, an adhesive layer may be provided between the substrate 110 and the housing 130.

For example, the adhesive layer may include an organic material. The adhesive layer may include an epoxy-based resin. In addition, the adhesive layer may include a silicone resin.

Meanwhile, a step may be provided in the upper region of the housing 130 in contact with the inner side. For example, a recess region 142 may be provided in an upper region of the housing 130. For example, the width and/or depth of the recess region 142 may be provided in several hundreds of micrometers.

The surface emitting laser package 106 according to the sixth embodiment may provide a diffusion part 140.

The diffusion part 140 may be disposed on the surface emitting laser device 206. The diffusion part 140 may be disposed to be spaced apart from the surface emitting laser device 206. The diffusion part 140 may be disposed in the recess region 142 of the housing 130. The diffusion part 140 may be supported by the recess region 142 of the housing 130.

An adhesive layer (not shown) may be provided between the diffusion part 140 and the recess region 142 of the housing 130. For example, the adhesive layer may be provided on a lower surface and a side surface of the diffusion part 140 in contact with the inner surface of the recess region 142. For example, the adhesive layer may include an organic material. The adhesive layer may include an epoxy-based resin. Alternatively, the adhesive layer may include a silicone resin.

The diffusion part 140 may expand the angle of view of the laser beam emitted from the surface emitting laser device 206.

The diffusion part 140 may include an anti-reflective function. For example, the diffusion part 140 may include an anti-reflective layer disposed on one surface opposite to the surface emitting laser device 206. The anti-reflective layer may be formed separately from the diffusion part 140. The diffusion part 140 may include an anti-reflective layer disposed on a lower surface facing the surface emitting laser device 206.

The non-reflective layer prevents the laser beam incident from the surface emitting laser device 206 from being reflected from the surface of the diffusion part 140 and transmits it into the diffusion part 140, thereby improving light loss due to reflection.

The anti-reflective layer may be formed of, for example, an anti-reflective coating film and attached to the surface of the diffusion part 140. The anti-reflective layer may be formed on the surface of the diffusion part 140 by spin coating or spray coating. For example, the anti-reflective layer may be formed as a single layer or multiple layers including at least one of a group including $TiO_2$, $SiO_2$, $Al_2O_3$, $Ta_2O_3$, $ZrO_2$, and $MgF_2$.

The surface emitting laser package 106 according to the sixth embodiment may provide a circuit board 160 including at least one signal line. The substrate 110 including the surface emitting laser device 206 may be mounted on the circuit board 160. For example, the circuit board 180 may include first and second signal lines. In this case, the first bonding part 183 disposed under the substrate 106 is electrically connected to the first signal line of the circuit board 160 and disposed under the substrate to be connected to the first bonding part 183. The second bonding part 184 spaced apart in the horizontal direction may be electrically connected to the second signal line of the circuit board 160.

Meanwhile, as described above, the substrate 110 and the housing 130 may be manufactured by a wafer level package process. According to the sixth embodiment, the diffusion part 140 may also be attached to the housing 130 by a wafer level package process.

That is, after the surface emitting laser device 206 and the housing 130 are attached to the substrate 110 at a wafer level, and the diffusion part 140 is attached to the housing 130, the substrate is cut by dicing or the like. A plurality of surface emitting laser packages in which the surface emitting laser device 206, the housing 130, and the diffusion part 140 are combined may be provided at the substrate 110.

As described above, the surface emitting laser package 106 including the substrate 110, the housing 130, and the diffusion unit 140 may be manufactured by a wafer level package process. Accordingly, the outer surface of the substrate 110 and the outer surface of the housing 130 may be disposed on the same plane. That is, there is no step difference between the outer surface of the substrate 110 and the outer surface of the housing 130.

In the sixth embodiment, there is no step difference between the outer surface of the substrate 110 and the outer surface of the housing 130. Accordingly, it is possible to fundamentally prevent defects in which damage is caused by moisture permeation and external friction due to a stepped structure in the conventional surface emitting laser package.

According to the sixth embodiment, the substrate 110 and the housing 130 are manufactured by a wafer level package process, and the diffusion part 140 may be attached on the housing 130 in a separate process.

According to the sixth embodiment, the diffusion part 140 may be stably fixed to the housing 130 by an adhesive layer provided between the diffusion part 140 and the recess region 142 of the housing 130.

Hereinafter, the surface emitting laser device 206 will be described in detail. FIG. 25 is a plan view of the surface emitting laser device according to the sixth embodiment, and FIG. 26 is a cross-sectional view taken along line I-I' of the surface emitting laser device according to the embodiment shown in FIG. 25.

The surface emitting laser device 206 according to the sixth embodiment may emit light having, for example, a peak wavelength of 940 nm and a full width at half maximum (FWHM) of about 2 nm. This light may have, for example, a wavelength band of 940±2 nm, but is not limited thereto.

Referring to FIG. 25, the surface emitting laser device 206 according to the sixth embodiment may include an emitting region 245 and a non-emitting region 247. The non-emitting region 247 is an area in which a laser beam is not emitted, and, for example, a pad electrode 290 may be disposed. The light emitting region 245 is a region from which the laser beam is emitted, and, for example, a light emitting structure E may be disposed.

The light emitting structure E may include a plurality of emitters E1, E2, E3, and E4. Each emitter (E1, E2, E3, E4) may be disposed spaced apart from each other. The light emitting structure E may include a second electrode 280. The emitting region 245 may include a first region and a second region. A plurality of first regions may be defined, and a region between the first regions may be defined as a second region. In this case, each emitter E1, E2, E3, and E4 may be disposed in the first region, and the second electrode 280 may be disposed in the second region. Each emitter E1, E2, E3, E4 may be surrounded by the second electrode 280. The second electrode 280 may be integrally formed with the pad electrode 290, but is not limited thereto. The second electrode 280 may extend from the pad electrode 290 to the emitting region 245 and be disposed in the emitting region 245. As will be described later, the second electrode 280 may electrically connect a plurality of emitters E1, E2, E3, and E4 to the pad electrode 290.

Referring to FIG. 26, the surface emitting laser device 206 according to the sixth embodiment includes a first electrode 215, a substrate 210, a first reflective layer 220, a cavity region 230, and an aperture 241, an insulating region 242, a second reflective layer 250, a second electrode 280, a passivation layer 270, and a pad electrode 290.

The cavity region 230 may include an active layer (not shown) and a cavity (not shown), which will be described in detail below. The insulating region 242 includes a first insulating region 242a disposed on the first emitter E1, a second insulating region 242b disposed on the second emitter E2 and a third insulating region 242c disposed on the third emitter E3, but is not limited thereto.

<Substrate, First Electrode>

In the sixth embodiment, the substrate 210 may be a conductive substrate or a non-conductive substrate. When a conductive substrate is used, a metal having excellent electrical conductivity may be used. In addition, since it must be able to sufficiently dissipate heat generated during the operation of the surface-emitting laser device 206, a GaAs substrate with high thermal conductivity, a metal substrate, or a silicon (Si) substrate may be used.

When a non-conductive substrate is used, an AlN substrate, a sapphire ($Al_2O_3$) substrate, or a ceramic-based substrate may be used.

In an embodiment, the first electrode 215 may be disposed under the substrate 210, and the first electrode 215 may be disposed as a single layer or multiple layers of a conductive material. For example, the first electrode 215 may be a metal, and includes at least one of aluminum (Al), titanium (Ti), chromium (Cr), nickel (Ni), copper (Cu), and gold (Au). Thus, it is formed in a single-layer or multi-layer structure to improve electrical characteristics, thereby increasing light output.

<First Reflective Layer>

A first reflective layer 220 may be disposed on the substrate 210.

The first reflective layer 220 may be doped with a first conductivity type dopant. For example, the first conductivity-type dopant may include an n-type dopant such as Si, Ge, Sn, Se, and Te.

In addition, the first reflective layer 220 may include a gallium-based compound, for example, AlGaAs, but is not limited thereto. The first reflective layer 220 may be a Distributed Bragg Reflector (DBR). For example, the first reflective layer 220 may have a structure in which a first layer and a second layer made of materials having different refractive indices are alternately stacked at least once or more.

The first layer and the second layer may include AlGaAs, and in detail, may be formed of a semiconductor material having a composition formula of $Al_xGa_{(1-x)}As(0<x<1)$. Here, when Al in the first layer or the second layer increases, the refractive index of each layer decreases, and when Ga increases, the refractive index of each layer may increase.

The thickness of each of the first and second layers is λ, λ may be a wavelength of light generated in the cavity region 230, and n may be a refractive index of each layer with respect to the light of the above-described wavelength. Here, λ may be 650 to 980 nm, and n may be the refractive index of each layer. The first reflective layer 220 having such a structure may have a reflectance of 99.999% for light in a wavelength region of about 940 nm.

The thicknesses of the first layer and the second layer may be determined according to each refractive index and the wavelength 2 of light emitted from the cavity region 230.

<Cavity Area, Insulation Area, Aperture>

In the sixth embodiment, the cavity region 230, the insulating region 242, and the aperture 241 may be disposed on the first reflective layer 220. Specifically, the cavity region 230 may be disposed on the first reflective layer 220, and the insulating region 242 and the aperture 241 may be disposed on the cavity region 230.

The cavity region 230 may include an active layer (not shown), a first cavity (not shown) disposed below the active layer, and a second cavity (not shown) disposed above the active layer. The cavity region 230 of the embodiment may include both the first cavity and the second cavity, or may include only one of the two.

The cavity region 230 may be disposed between the first reflective layer 220 and the second reflective layer 250. An active layer may be disposed in the cavity region 230 of the embodiment, and the active layer may include any one of a single well structure, a multiple well structure, a single quantum well structure, a multi-quantum well (MQW) structure, a quantum dot structure, or the quantum wire structure.

The active layer may be formed in a pair structure such as a well layer and a barrier layer, for example, AlGaInP/GaInP, AlGaAs/AlGaAs, AlGaAs/GaAs, and GaAs/InGaAs using a compound semiconductor material of group III-V element, but is not limited thereto. The well layer may be formed of a material having an energy band gap smaller than that of the barrier layer.

The first cavity and the second cavity may be formed of $Al_yGa_{(1-y)}As(0<y<1)$, but is not limited thereto.

In the sixth embodiment, the insulating region 242 and the aperture 241 may be disposed on the cavity region 230.

For example, the first emitter E1 includes a first insulating region 242a and a first aperture 241a, and the second emitter E2 includes a second insulating region 242b and a second aperture 241b. In addition, the third emitter E3 includes a third insulating region 242c and a third aperture 241c, and the fourth emitter E4 includes a fourth insulating region (not shown) and a fourth aperture (not shown).

The insulating region 242 is an insulating layer made of an insulating material, for example, aluminum oxide, and may function as a current blocking layer. Each of the apertures 241a, 241b, and 241c positioned in the central region of each insulating region may be a non-insulating layer, that is, a conductive layer.

The insulating region 242 may surround the aperture 241. The size of the aperture 241 may be adjusted by the insulating region 242. For example, as the area of the insulating region 242 occupied on the cavity area 230 increases, the area of the aperture 241 may decrease.

For example, the first aperture 241a may be defined by the first insulating region 242a and for example, the second aperture 241b may be defined by the second insulating region 242b. Also, the third aperture 241c may be defined by the third insulating region 242c, and the fourth aperture may be defined by the fourth insulating region. Specifically, each insulating region 242 may include aluminum gallium arsenide. For example, in the insulating region 242, as AlGaAs reacts with $H_2O$ and the edge changes to aluminum oxide ($Al_2O_3$), the insulating region 242 may be formed. And since the central region is not reacted with $H_2O$, an aperture can be formed of AlGaAs.

In the sixth embodiment, a laser beam emitted from the cavity region 230 through the apertures 241a, 241b, and 241c may be emitted toward the upper region. In this case, the light transmittance of the apertures 241a, 241b, and 241c may be superior compared to the insulating regions 242a, 242b, and 242c.

<Second Reflective Layer>

The second reflective layer 250 may be disposed on the cavity region 230.

The second reflective layer 250 may include a gallium-based compound, for example, AlGaAs, and the second reflective layer 250 may be doped with a second conductivity type dopant. For example, the second conductivity-type dopant may be a p-type dopant such as Mg, Zn, Ca, Sr, Ba, or the like. Meanwhile, the first reflective layer 220 may be doped with a p-type dopant, and the second reflective layer 250 may be doped with an n-type dopant.

The second reflective layer 250 may be a Distributed Bragg Reflector (DBR). For example, the second reflective layer 250 may have a structure in which a first layer (not shown) and a second layer (not shown) made of materials having different refractive indices are alternately stacked at least once or more.

The first layer and the second layer may include AlGaAs, and in detail, may be formed of a semiconductor material having a composition formula of $AlxGa_{(1-x)}As$ (0<x<1). Here, when Al increases, the refractive index of each layer decreases, and when Ga increases, the refractive index of each layer may increase. In addition, the thickness of each of the first layer and the second layer is $\lambda$, $\lambda$ may be a wavelength of light emitted from the active layer, and n may be a refractive index of each layer with respect to light of the above-described wavelength.

The second reflective layer 250 having such a structure may have a reflectance of 99.9% for light in a wavelength region of 940 nm.

The second reflective layer 250 may be formed by alternately stacking third and fourth layers, and the number of pairs of the first and second layers in the first reflective layer 220 may be greater than the number of pairs of the third and fourth layers in the second reflective layer 250. And as described above, the reflectance of the first reflective layer 220 is about 99.999%, which is greater than 99.9%, which is the reflectance of the second reflective layer 250. For example, the number of pairs of the first layer and the second layer in the first reflective layer 220 may be 20 to 50 times, and the number of pairs of the third and fourth layers in the second reflective layer 250 may be up to 10 to 30 times.

<Passivation Layer, Second Electrode>

The passivation layer 270 is disposed on the side and top surfaces of the emitters E1, E2, E3, E4, and the top surface of the first reflective layer 220 exposed between the emitters E1, E2, E3, and E4. The passivation layer 270 is disposed on the side of each emitter (E1, E2, E3, E4) separated by a segment unit, and can protect and insulate each emitter (E1, E2, E3, E4). The passivation layer 270 may be made of an insulating material, for example, a nitride or an oxide.

The second electrode 280 may be disposed to be electrically connected to the second reflective layer 250. That is, the second electrode 280 extends from the pad electrode 290 and contacts a part of the second reflective layer 250 through the passivation layer 270 surrounding each emitter E1, E2, E3, E4. The second electrode 280 may be disposed on the passivation layer 270.

The second electrode 280 may be made of a conductive material, and may be, for example, a metal. For example, the second electrode 280 includes at least one of aluminum (Al), titanium (Ti), chromium (Cr), nickel (Ni), copper (Cu), and gold (Au), and has a single layer or multilayer structure.

As shown in FIG. 25, the surface emitting laser device 206 may include a light emitting region 245 from which a laser beam is emitted, and a non-emitting region 247 in contact with the light emitting region 245 without the laser beam being emitted.

The non-emitting region 247 is an area in which the pad electrode 290 as a bonding pad for electrical connection with the outside is disposed, and no laser beam is generated in the non-emitting region 247. The light emitting region 245 may include the light emitting structure E, and the light emitting structure E may include a plurality of emitters E1, E2, E3, and E4. A laser beam is generated in each of the plurality of emitters E1, E2, E3, and E4, and the generated laser beam may be emitted toward an upper direction. Accordingly, the emitting region 245 may be a region in which laser beams generated by the plurality of emitters E1, E2, E3, and E4 are emitted.

While the surface emitting laser device 206 including the light emitting region 245 and the non-emitting region 247 has a square shape, the light emitting region 245 of the surface emitting laser device 206 may have a rectangular shape but, it is not limited thereto. The light emitting region 245 may have a first width W1 in the x-axis direction (hereinafter referred to as a first direction) and a second width W2 in the y-axis direction (hereinafter, referred to as a second direction). The second width W2 may be larger than the first width W1. Accordingly, the emitting region 245 may have a rectangular shape that is longer in the second direction than in the first direction.

Referring back to FIG. 24, the surface emitting laser package 106 according to the sixth embodiment may provide a wavelength limiting member 150.

The wavelength limiting member 150 may be disposed on the diffusion part 140. The wavelength limiting member 150 may be disposed on the housing 130. The area (size) of the wavelength limiting member 150 may be larger than the area (size) of the diffusion part 140. In this case, the wavelength limiting member 150 may be disposed on the housing 130 as well as the diffusion part 140.

The wavelength limiting member 150 may contact the entire area of the upper surface of the diffusion part 140 and may contact the upper surface of the housing 130. The wavelength limiting member 150 may be attached to the diffusion part 140 and the housing 130 using an adhesive (not shown). The adhesive material may include a silicone resin.

The wavelength limiting member 150 may have a thickness of 0.1 mm to 0.5 mm. The wavelength limiting member 150 may have a thickness of approximately 0.3 mm, but is not limited thereto. When the wavelength limiting member 150 is less than 0.1 mm, it may be difficult to block the wavelength. When the wavelength limiting member 150 exceeds 0.5 mm, absorption of light is increased, and the amount of light output from the wavelength limiting member 150 may decrease, thereby reducing light output efficiency.

The wavelength limiting member 150 may pass at least a wavelength band of light of the surface emitting laser device 206. For example, when the surface emitting laser device 206 emits light in a wavelength band of 940±2 nm, the wavelength limiting member 150 may pass light in a wavelength band greater than the wavelength band of at least 940±2 nm.

As shown in FIG. 29, the wavelength limiting member 150 may emit light having a peak wavelength of 940 nm and a half width (FWHM) of approximately 10 nm. Accordingly, the wavelength limiting member 150 may transmit light having a wavelength band of 940±5 nm, for example, and block light having a wavelength band out of the wavelength band of 940±5 nm. For example, when light having a peak wavelength of 948 nm is emitted from the surface emitting laser device 206, any light is blocked by the wavelength limiting member 150 according to the sixth embodiment so that any light may be output through the wavelength limiting member 150.

The peak wavelength of light allowed by the wavelength limiting member 150 may be the same as the peak wavelength of light emitted from the surface emitting laser device 206. That is, a peak wavelength of light allowed by the wavelength limiting member 150 and a peak wavelength of light emitted from the surface emitting laser device 206 may be 940 nm. The half width (FWHM) of light allowed by the wavelength limiting member 150 may be equal to or greater than the half width of light emitted from the surface emitting laser device 206. That is, the half width (FWHM) of light allowed by the wavelength limiting member 150 may be 1 to 3 times the half width of light emitted from the surface emitting laser device 206. When the half width (FWHM) of light allowed by the wavelength limiting member 150 is less than 1 times the half width of light emitted from the surface emitting laser device 206, the wavelength limiting member 150 is emitted from the surface emitting laser device 206 A part of the wavelength band of light is blocked so that the desired color light cannot be emitted.

When the half width (FWHM) of light allowed by the wavelength limiting member 150 is more than three times the half width of light emitted from the surface emitting laser device 206, some wavelength bands out of the wavelength band of the light emitted from the surface emitting laser device 206 are also passed by the wavelength limiting member 150, so that the performance of the wavelength limiting member 150 may be deteriorated.

The wavelength limiting member 150 may be, for example, a single layer or a filter or film having a multilayer structure. For example, the filter may be an infrared pass filter that transmits light having a wavelength band of 940±5 nm. For example, the film may be a multilayer thin film having different refractive indices. Such a multilayer thin film may be made of an insulating material, such as an organic material or an inorganic material. A thin film in which inorganic materials having different refractive indices are stacked may be formed, or a thin film in which organic materials and inorganic materials having different refractive indices are stacked may be formed.

A larger current may flow through the surface emitting laser device 206 due to malfunction or over-operation of the driving circuit that drives the surface emitting laser package 106. For example, in normal operation, a current of, for example, 1000 mA may flow through the surface emitting laser device 206. In an abnormal operation in which a malfunction or over-operation occurs, a current of, for example, 3000 mA may flow through the surface emitting laser device 206. As described above, when a larger current flow through the surface emitting laser device 206 due to an abnormal operation, heat is generated in the surface emitting laser device 206, and the wavelength band of light emitted from the surface emitting laser device 206 can be shifted by this heat. This may be due to changes in the band gap energy of the semiconductor material of the surface emitting laser device 206 by heat.

As shown in FIG. 28, for example, the band gap energy of InP is 1.35 eV at room temperature (300K at 23° C. absolute temperature), but as the temperature increases, the band gap energy of InP may be less than 1.35 eV. Since the wavelength is inversely proportional to the bandgap energy, the inherent wavelength band of light of a semiconductor device made of InP may be shifted to a larger wavelength band as the temperature increases.

Other semiconductor materials, such as GaN, Si, and Ge, can also be changed in a similar manner to InP. That is, GaN, Si, and Ge may also shift the inherent wavelength band of light to a larger wavelength band.

Likewise, in the surface emitting laser device 206 according to the sixth embodiment, a unique wavelength band may be shifted to a larger wavelength band according to temperature. The inherent wavelength band of the surface emitting laser device 206 may be 940±2 nm.

FIG. 27 shows a state in which the peak wavelength of light is shifted according to the current. Specifically, FIG. 27A shows a state in which the peak wavelength changes according to the current, FIG. 27B shows a state in which the output power changes according to the current, and FIG. 27C shows a state in which the wavelength and light intensity change according to the current.

As shown in FIG. 27A, when, for example, 1000 mA flows through the surface emitting laser device 206 during normal operation, the surface emitting laser device 206 may emit light having a wavelength band of approximately 940±2 nm. When, for example, 3000 mA flows through the surface emitting laser device 206 during an abnormal operation, the surface emitting laser device 206 may emit light having a wavelength band of approximately 946±4 nm. From this, the temperature increases as the current increases due to an abnormal operation, and the band gap energy decreases as the temperature increases, so that the wavelength band of light of the surface emitting laser device 206 can be shifted to a larger wavelength band.

As shown in FIG. 27B, as the current increases, the output power may also increase. For example, when 1000 mA flows through the surface emitting laser device 206 during normal operation, the output power Po output from the surface emitting laser device 206 may be 1.3 W. When 3000 mA flows through the surface emitting laser device 206 during an abnormal operation, the output power Po output from the surface emitting laser device 206 may be 2.5 W.

As shown in FIG. 27C, as the current increases, not only the wavelength band is shifted, but also the intensity of light may be increased. The intensity of light has the same meaning as the output power shown in FIG. 27B, and is a quantified (normalized) output power.

During normal operation, that is, when a current of 1000 mA flows through the surface emitting laser device 206, light having a wavelength band of 940±2 nm from the surface emitting laser device 206 may be emitted with an intensity of 0.4. During an abnormal operation, that is, when a current of 3000 mA flows through the surface emitting laser device 206, light having a wavelength band of 946±4 nm in the surface emitting laser device 206 may be emitted with an intensity of 0.5. From this, a larger current flows through the surface emitting laser device 206 during abnormal operation, and heat is generated in the surface emitting laser device 206 by this current, so that not only the wavelength band of light is shifted, but also the intensity of light is increased.

When light shifted to a larger wavelength band and increased in intensity is left unattended, the user's eyes may be damaged by such light.

In the above description, the wavelength band of 940±2 nm of light emitted from the surface emitting laser device 206 during normal operation is referred to as a unique wavelength band (first wavelength band), and during abnormal operation, the surface emitting laser device 206, the wavelength band of 946±4 nm may be referred to as a shift wavelength band (the second wavelength band).

According to the sixth embodiment, the wavelength limiting member 150 is provided on the surface emitting laser device 206, thereby blocking wavelengths outside the wavelength band of light emitted from the surface emitting laser device 206 due to an abnormal operation and it can prevent damage to user's eyes.

According to the sixth embodiment, the wavelength limiting member 150 may be attached to the housing 130 as well as the diffusion unit 140. Accordingly, separation of the diffusion unit 140 may be prevented, and light from the surface-emitting laser device 206 may not be directly radiated to the outside, thereby preventing the user's eyes from being damaged.

Seventh Embodiment

FIG. 30 is a cross-sectional view illustrating a surface emitting laser package 100A according to a seventh embodiment.

The seventh embodiment is the same as the sixth embodiment, except that the wavelength limiting member 150 is disposed only on the diffusion part 140. Accordingly, features not described in the following description can be easily understood from the sixth embodiment already described above.

Referring to FIG. 30, the surface emitting laser package 100A according to the seventh embodiment includes a substrate 110, a surface emitting laser device 206, a housing 130, a diffusion part 140, and a wavelength limiting member 150. The substrate 110, the surface emitting laser device 206, the housing 130, the diffusion part 140, and the wavelength limiting member 150 may be configured as a modular module. The surface emitting laser package 100A according to the seventh embodiment may further include a circuit board 160 on which one or more modules are mounted, but is not limited thereto.

The area (size) of the wavelength limiting member 150 may be the same as the area (size) of the diffusion part 140. The wavelength limiting member 150 may be disposed on the upper surface of the diffusion part 140. The wavelength limiting member 150 may contact the upper surface of the diffusion part 140. That is, the wavelength limiting member 150 may be attached to the upper surface of the diffusion part 140 using an adhesive material. The adhesive material may include a silicone resin.

The upper surface of the wavelength limiting member 150 may be horizontally aligned with the upper surface of the housing 130. Since the upper surface of the wavelength limiting member 150 does not protrude above the housing 130, detachment of the wavelength limiting member 150 due to friction with the surrounding may be prevented. Accordingly, the depth of the recess of the housing 130 may be equal to the sum of the thickness of the diffusion part 140 and the thickness of the wavelength limiting member 150.

Eighth Example

FIG. 31 is a cross-sectional view illustrating a surface emitting laser package 100B according to an eighth embodiment.

The eighth embodiment is the same as the sixth embodiment except that the wavelength limiting member 150 is disposed only in the diffusion part 140. In addition, the eighth embodiment is the same as the seventh embodiment except for the arrangement position of the diffusion part 140. Accordingly, features not described in the following description can be easily understood from the first and seventh embodiments already described above.

Referring to FIG. 31, a surface emitting laser package 100B according to an eighth embodiment includes a substrate 110, a surface emitting laser device 206, a housing 130, a diffusion part 140, and a wavelength limiting member 150. The substrate 110, the surface emitting laser device 206, the housing 130, the diffusion part 140, and the wavelength limiting member 150 may be configured as a modular module. The surface emitting laser package 100B according to the eighth embodiment may further include a circuit board 160 on which one or more modules are mounted, but is not limited thereto.

The wavelength limiting member 150 may be disposed on the lower surface of the diffusion part 140. The wavelength limiting member 150 may contact the lower surface of the diffusion part 140. That is, the wavelength limiting member 150 may be attached to the lower surface of the diffusion part 140 using an adhesive material. The adhesive material may include a silicone resin.

The area (size) of the wavelength limiting member 150 may be smaller than the area (size) of the diffusion part 140. That is, the area (size) of the wavelength limiting member 150 may be equal to or smaller than the area (size) of the opening formed inside the housing 130. In this case, the wavelength limiting member 150 is not disposed in the recessed area of the housing 130.

As another example, although not shown, the area (size) of the wavelength limiting member 150 may be the same as the area (size) of the diffusion part 140. In this case, the peripheral region of the wavelength limiting member 150 disposed under the diffusion part 140 may be disposed in the recess region of the housing 130.

Meanwhile, the upper surface of the diffusion part 140 may be horizontally aligned with the upper surface of the housing 130. Since the top surface of the diffusion part 140 does not protrude above the housing 130, detachment of the diffusion part 140 due to friction with the surrounding area may be prevented.

Ninth Embodiment

FIG. 32 is a cross-sectional view showing a surface emitting laser package 100C according to the ninth embodiment.

The ninth embodiment is the same as the sixth embodiment, except that the wavelength limiting member 150 is disposed only in the diffusion part 140. In addition, the ninth embodiment is the same as the seventh embodiment except for the arrangement position of the diffusion part 140. In addition, the ninth embodiment is the same as the eighth embodiment except that the diffusion part 140 is disposed under the pattern 145 provided on the diffusion part 140. Therefore, features not described in the following description can be easily understood from the first to eighth embodiments already described above.

Referring to FIG. 32, the surface emitting laser package 100C according to the ninth embodiment includes a substrate 110, a surface emitting laser device 206, a housing 130, a diffusion part 140, and a wavelength limiting member 150. The substrate 110, the surface emitting laser device 206, the housing 130, the diffusion part 140, and the wavelength limiting member 150 may be configured as a modular module. The surface emitting laser package 100C according to the ninth embodiment may further include a circuit board 160 on which one or more modules are mounted, but is not limited thereto.

The diffusion part 140 may include a body 141 and a plurality of patterns 145. The pattern 145 may be disposed under the body 141.

The body 141 may be made of a material having excellent durability and strength, such as glass. The pattern 145 may be made of a material that is easy to process, such as a polymer resin.

As another example, the pattern 145 and the body 141 may be made of the same material, glass, or polymer resin. For example, the surface of the polymer resin base substrate 141 may be surface-treated to form the pattern 145 on the surface of the base substrate 141.

The pattern 145 may be disposed on the lower surface of the body 141 of the diffusion parts 140 140 so as to face the surface emitting laser device 206.

For example, the pattern 145 may include a micro lens, an uneven pattern, or the like. The size of the pattern 145 may be uniform, but is not limited thereto.

Each pattern 145 may have the same size. Alternatively, each pattern 145 may have a random shape different from each other.

The thickness (or height) of each pattern 145 may be the same. Alternatively, the thickness (or height) of each pattern 145 may be different from each other. The pattern 145 may have a protruding region protruding from the body 141 in a lower direction, for example. The lowest point of the protruding area may be the same or different for each pattern 145. The lowest point of the protruding area may have a vertex, but is not limited thereto. The surface of each pattern 145 may have a round shape, a straight line shape, or the like. Each pattern 145 may have an uneven shape. Some patterns may be disposed in contact with each other, and other patterns may be disposed apart from each other.

The wavelength limiting member 150 may be disposed on the lower surface of the diffusion part 140, specifically, on the lower surface of the plurality of patterns 145. The wavelength limiting member 150 may contact the lower surface of the pattern 145 of the diffusion part 140. That is, the wavelength limiting member 150 may be attached to the lower surface of the pattern 145 of the diffusion part 140 by using an adhesive. The adhesive material may include a silicone resin.

In the above description, the light emitted from the surface emitting laser device 206 is limited to having a wavelength band of 940±2 nm, but the embodiment is not limited thereto and emits light of any wavelength band including ultraviolet rays and visible rays. The same can be applied to the surface emitting laser device. For example, when the wavelength band of light emitted from the surface emitting laser device is 200±2 nm and is an ultraviolet wavelength band, for example, a wavelength limiting member for passing only this ultraviolet wavelength band and blocking other wavelengths may be adopted.

Meanwhile, the surface emitting laser packages 106, 100A, 100B, and 100C according to the embodiment described above may be applied to a proximity sensor, an auto focus device, and the like. For example, the autofocusing device according to the embodiment may include a light emitting part for emitting light and a light receiving part for receiving light.

As an example of the light emitting part, at least one of the surface emitting laser packages 106, 100A, 100B, and 100C according to the embodiment described with reference to FIG. 24 may be applied. As an example of the light receiving part, a photodiode may be applied. The light receiving part may receive light reflected from an object by light emitted from the light emitting part.

The auto focus device can be variously applied to a mobile terminal, a camera, a vehicle sensor, an optical communication device, and the like. The auto focus device can be applied to various fields for multi-position detection that detects the position of an object.

Features, structures, effects, and the like described in the embodiments above are included in at least one embodiment, and are not necessarily limited to only one embodiment. Further, the features, structures, effects, etc. illustrated in each embodiment may be combined or modified for other embodiments by a person having ordinary knowledge in the field to which the embodiments belong. Therefore, contents related to such combinations and modifications should be interpreted as being included in the scope of the embodiments.

Although the embodiments have been described above, these are only examples and are not intended to limit the embodiments, and it will be seen that branch transformation and application are possible to those of ordinary skill in the field to which the embodiments belong as long as not departing from the essential characteristics of the embodiments. For example, each component specifically shown in the embodiment can be modified and implemented. And differences related to these modifications and applications should be construed as being included in the scope of the embodiments set in the appended claims.

INDUSTRIAL APPLICABILITY

As described above, the surface emitting laser package according to the embodiment may include a vertical cavity surface emitting laser semiconductor device (VCSEL).

The vertical cavity surface emitting laser semiconductor device can convert an electrical signal into an optical signal. In the vertical cavity surface emitting laser semiconductor device, unlike a general side emitting laser (LD), a circular laser beam may be emitted vertically from the substrate surface. Accordingly, the vertical cavity surface emitting laser semiconductor device has an advantage that it is easy to connect to a light receiving device or an optical fiber, and it is easy to arrange a two-dimensional signal, thereby enabling parallel signal processing. In addition, the vertical cavity surface emitting laser semiconductor device has advantages such as high-density integration, low power consumption, simple manufacturing process, and good heat resistance by miniaturization of the device.

As an application field of vertical cavity surface emitting laser semiconductor device, it can be applied to laser printer, laser mouse, DVI, HDMI, high speed PCB, home network, etc. in the digital media sector. In addition, the vertical cavity surface emitting laser semiconductor device can be applied to automotive fields such as multimedia networks and safety sensors in automobiles. In addition, the vertical cavity surface emitting laser semiconductor device can be applied to information and communication fields such as Gigabit Ethernet, SAN, SONET, and VSR. In addition, the vertical cavity surface emitting laser semiconductor device can be applied to sensor fields such as encoders and gas sensors. In addition, the vertical cavity surface emitting laser semiconductor device can be applied to medical and bio fields such as blood glucose meters and skin care lasers.

In addition, the surface emitting laser package according to the embodiment described above may be applied to a proximity sensor, an auto focus device, or the like. The autofocus device may be variously applied to a mobile terminal, a camera, a vehicle sensor, an optical communication device, and the like. The auto focus device can be applied to various fields for multi-position detection that detects the position of an object.

For example, FIG. 33 is a perspective view of a mobile terminal to which a surface emitting laser device according to an embodiment is applied.

The vertical type surface emitting laser device and the flip type surface emitting laser device according to the embodiment may be applied to the mobile terminal shown in FIG. 33.

As shown in FIG. 33, the mobile terminal 1500 according to the embodiment may include a camera module 1520, a flash module 1530, and an autofocus device 1510 provided on the rear side. Here, the autofocus device 1510 may include one of the packages of the surface emitting laser device according to the above-described embodiment as an emission layer.

The flash module 1530 may include a light emitting device that emits light therein. The flash module 1530 may be operated by a camera operation of a mobile terminal or a user's control.

The camera module 1520 may include an image capturing function and an auto focus function. For example, the camera module 1520 may include an auto focus function using an image.

The auto focus device 1510 may include an auto focus function using a laser. The auto focus device 1510 may be mainly used in a condition in which an auto focus function using an image of the camera module 1520 is deteriorated, for example, in a proximity or dark environment of 10 m or less. The autofocusing device 1510 may include a light emitting layer including the surface emitting laser device of the above-described embodiment and a light receiving unit that converts light energy such as a photodiode into electrical energy.

The invention claimed is:

1. A surface emitting laser package comprising:
    a housing including a cavity having a first cavity and a second cavity on the first cavity, wherein the first cavity and the second cavity are connected to each other to form one hollow space;
    a surface emitting laser device disposed in the first cavity; and
    a diffusion part disposed in the second cavity,
    wherein a width of the second cavity is wider than that of the first cavity,
    wherein the diffusion part comprises:
        a polymer layer having a flat top surface disposed on the second cavity; and
        a glass layer having a flat bottom surface disposed on the flat top surface of the polymer layer; and
        an adhesive member between the housing and a bottom surface of the polymer layer,
        wherein the polymer layer includes a first layer vertically overlapping the surface emitting laser device, and a second layer not vertically overlapping the surface emitting laser device,
        wherein the second layer comprises protruding portions at both end of the first layer,
        wherein each top surface of the first layer and the second layer is disposed at a same level,
        wherein a ratio of a thickness of the second layer in a vertical direction to a thickness of the glass layer in the vertical direction is in a range of greater than 1 and less than or equal to 3, and
        wherein a ratio of a thermal expansion coefficient of the adhesive member to a thermal expansion coefficient of the polymer layer is in a range of greater than 1 and less than or equal to 2.

2. A light emitting device comprises the surface emitting laser package according to claim 1.

3. The surface emitting laser package according to the claim 1, wherein a thickness of the first layer is thinner than that of the second layer.

4. A surface emitting laser package comprising:
    a housing including a cavity having a first cavity and a second cavity on the first cavity, wherein the first cavity and the second cavity are connected to each other to form one hollow space;
    a surface emitting laser device disposed in the first cavity; and
    a diffusion part disposed in the second cavity,
    wherein the diffusion part comprises:
        a polymer layer; and
        a glass layer disposed on the polymer layer,
    wherein the polymer layer comprises:
        a first layer vertically overlapping the surface emitting laser device;
        a second layer not vertically overlapping the surface emitting laser device; and
        an adhesive member between the housing and a bottom surface of the polymer layer,
        wherein a thickness of the second layer in a vertical direction is greater than a thickness of the first layer in the vertical direction,
        wherein a ratio of the thickness of the second layer in the vertical direction to a thickness of the glass layer in the vertical direction is in a range of greater than 1 and less than or equal to 3, and
        wherein a ratio of a thermal expansion coefficient of the adhesive member to a thermal expansion coefficient of the polymer layer is in a range of greater than 1 and less than or equal to 2.

5. The surface emitting laser package according to claim 4, wherein a bottom surface of the first layer is patterned.

6. A surface emitting laser package comprising:
    a housing including a cavity having a first cavity and a second cavity on the first cavity, wherein the first cavity and the second cavity are connected to each other to form one hollow space;
    a surface emitting laser device disposed in the first cavity; and
    a diffusion part disposed in the second cavity,
    wherein the diffusion part comprises:
        a polymer layer; and
        a glass layer disposed on the polymer layer,
    wherein the polymer layer comprises:
        a first layer vertically overlapping the surface emitting laser device;
        a second layer not vertically overlapping the surface emitting laser device; and
        an adhesive member between the housing and a bottom surface of the second layer,
        wherein a bottom surface of the first layer is patterned,
        wherein a ratio of a thickness of the second polymer layer in a vertical direction to a thickness of the glass layer in the vertical direction is in a range of greater than 1 and less than or equal to 3, and
        wherein a ratio of a thermal expansion coefficient of the adhesive member to a thermal expansion coefficient of the polymer layer is in a range of greater than 1 and less than or equal to 2.

* * * * *